(12) United States Patent
Shimizu et al.

(10) Patent No.: US 9,786,680 B2
(45) Date of Patent: Oct. 10, 2017

(54) SEMICONDUCTOR DEVICE

(71) Applicant: Toshiba Memory Corporation, Minato-ku (JP)

(72) Inventors: Shun Shimizu, Yokkaichi (JP); Hiroki Yamashita, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/008,753

(22) Filed: Jan. 28, 2016

(65) Prior Publication Data

US 2017/0077027 A1 Mar. 16, 2017

Related U.S. Application Data

(60) Provisional application No. 62/216,770, filed on Sep. 10, 2015.

(51) Int. Cl.
*H01L 27/115* (2017.01)
*H01L 27/11582* (2017.01)
*H01L 27/11568* (2017.01)
*H01L 27/11556* (2017.01)
*H01L 27/1157* (2017.01)
*H01L 23/528* (2006.01)

(52) U.S. Cl.
CPC .. *H01L 27/11582* (2013.01); *H01L 27/11568* (2013.01); *H01L 23/5283* (2013.01); *H01L 27/1157* (2013.01); *H01L 27/11556* (2013.01)

(58) Field of Classification Search
CPC ......... H01L 27/11568; H01L 27/11582; H01L 21/28282; H01L 29/518; H01L 23/522; H01L 23/5226; H01L 23/5228; H01L 27/1157; H01L 27/11556; H01L 23/5283
See application file for complete search history.

(56) References Cited

U.S. PATENT DOCUMENTS

| | | | |
|---|---|---|---|
| 8,227,897 B2 | 7/2012 | Kim | |
| 8,643,142 B2 | 2/2014 | Higashitani et al. | |
| 2010/0320526 A1* | 12/2010 | Kidoh | H01L 23/522 257/324 |

(Continued)

FOREIGN PATENT DOCUMENTS

JP  2013-187506  9/2013

*Primary Examiner* — Nathan W Ha
(74) *Attorney, Agent, or Firm* — Oblon, McClelland, Maier & Neustadt, L.L.P.

(57) ABSTRACT

A semiconductor device includes: a semiconductor substrate, a first portion and a second portion of an upper layer portion of the semiconductor substrate being conductive; an insulating member electrically isolating the first portion from the second portion; a first stacked body provided in a region directly above the second portion, the first stacked body including first insulating films and electrode films stacked alternately; a semiconductor pillar provided inside the first stacked body and extending in a stacking direction; a charge storage film provided between the semiconductor pillar and the electrode films; a second stacked body provided in a region directly above the first portion, the second stacked body including second insulating films and third insulating films stacked alternately; and two first conductive pillars provided inside the second stacked body extending in the stacking direction, lower ends thereof being connected to the first portion.

18 Claims, 20 Drawing Sheets

(56) References Cited

U.S. PATENT DOCUMENTS

| | | | |
|---|---|---|---|
| 2011/0147818 A1* | 6/2011 | Katsumata | H01L 27/11573 |
| | | | 257/314 |
| 2011/0169071 A1* | 7/2011 | Uenaka | H01L 27/105 |
| | | | 257/326 |
| 2012/0051137 A1* | 3/2012 | Hung | G11C 16/0466 |
| | | | 365/185.17 |
| 2012/0184078 A1* | 7/2012 | Kiyotoshi | H01L 27/1157 |
| | | | 438/268 |
| 2013/0065386 A1* | 3/2013 | Kim | H01L 29/7926 |
| | | | 438/591 |
| 2014/0061754 A1 | 3/2014 | Murakami | |
| 2014/0217518 A1* | 8/2014 | Shih | H01L 27/11573 |
| | | | 257/401 |
| 2014/0252363 A1* | 9/2014 | Liu | H01L 27/11556 |
| | | | 257/66 |
| 2015/0179662 A1* | 6/2015 | Makala | H01L 27/11582 |
| | | | 257/314 |
| 2015/0194441 A1* | 7/2015 | Yatsuda | H01L 27/11582 |
| | | | 438/587 |

\* cited by examiner

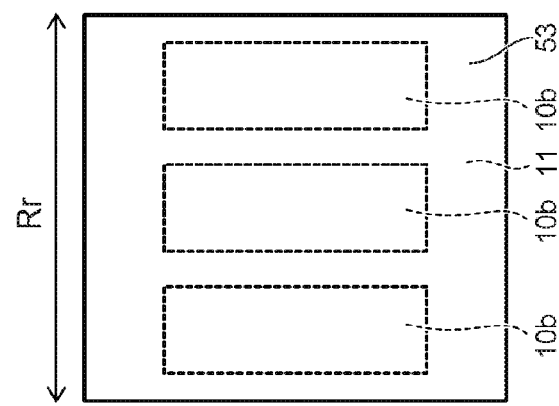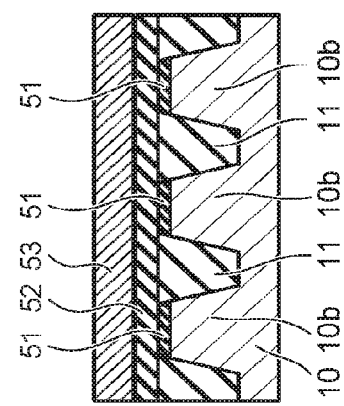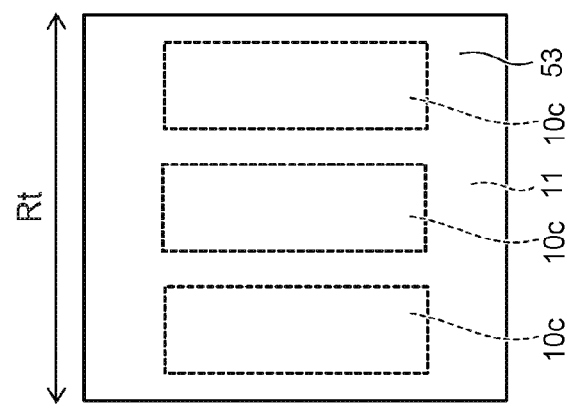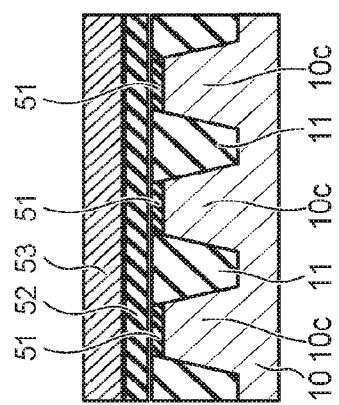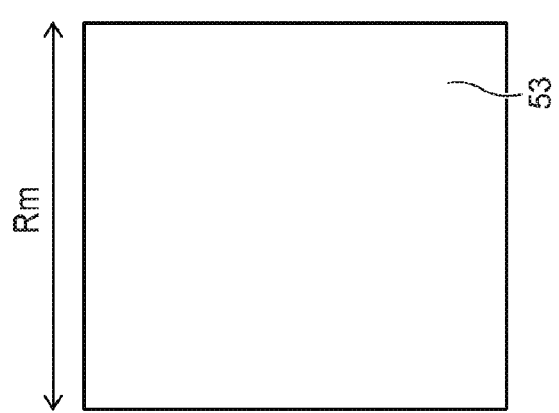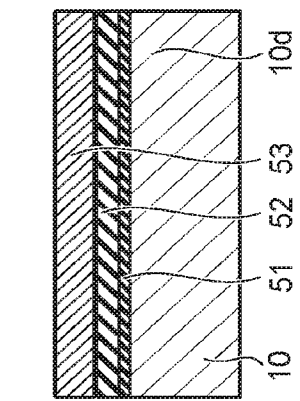

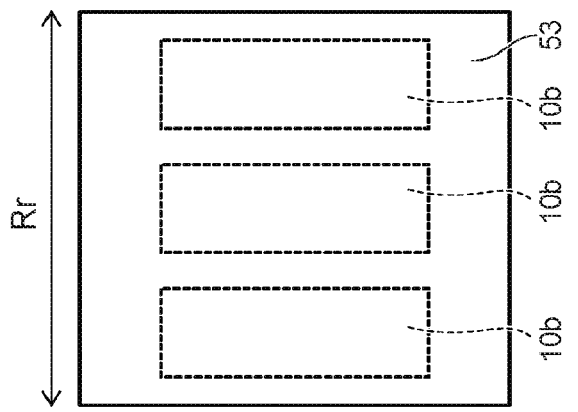
FIG. 8A
FIG. 8B
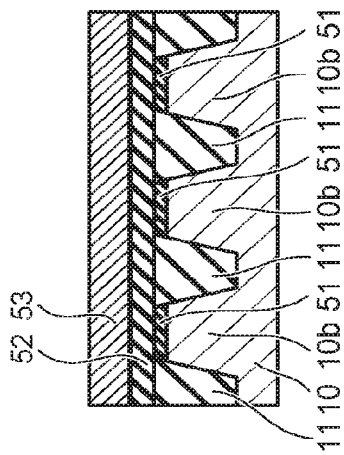
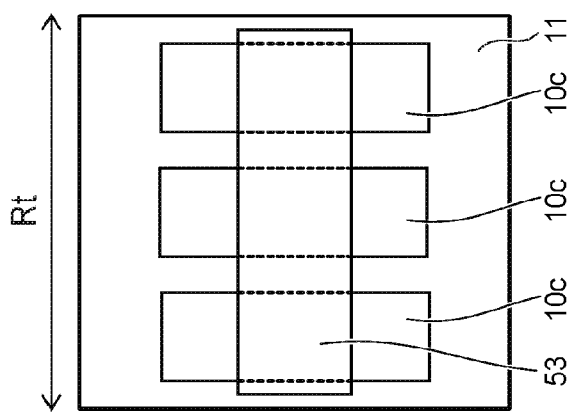
FIG. 8C
FIG. 8D
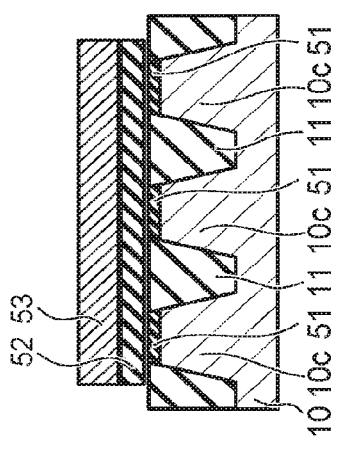
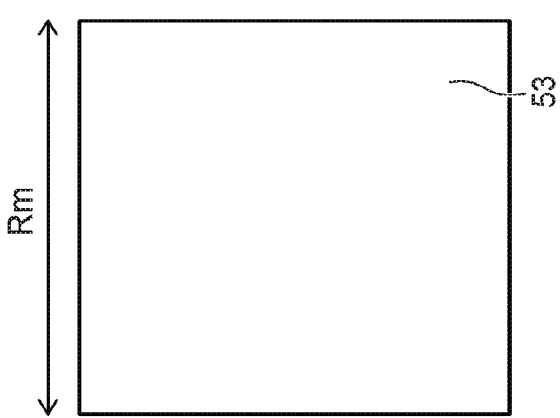
FIG. 8E
FIG. 8F
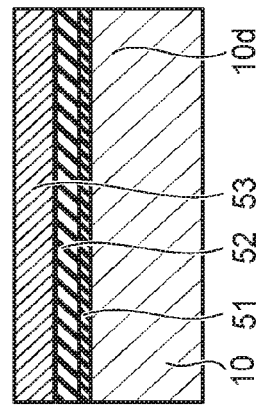

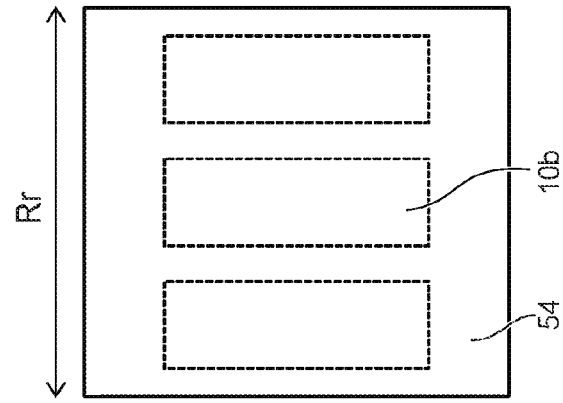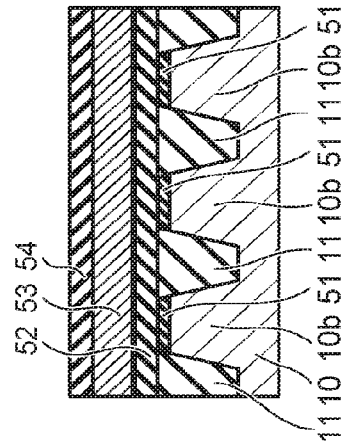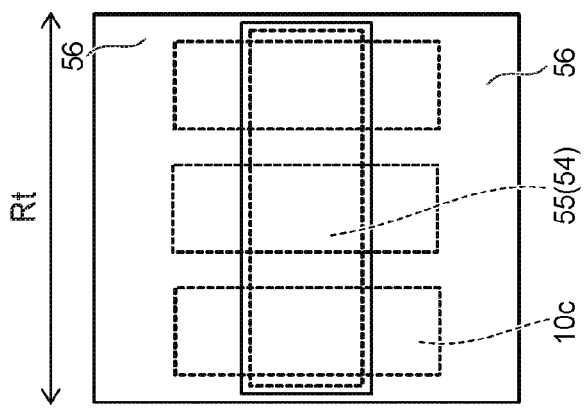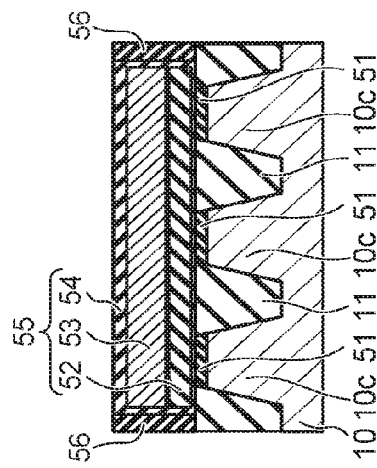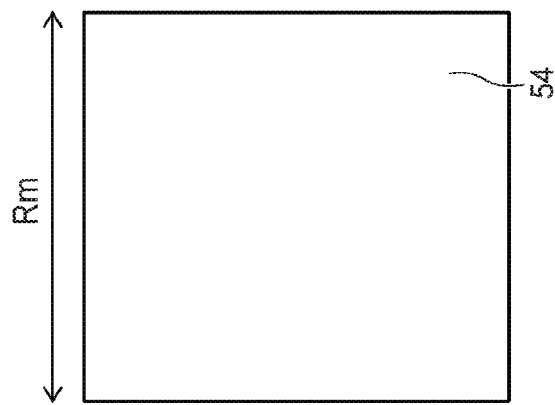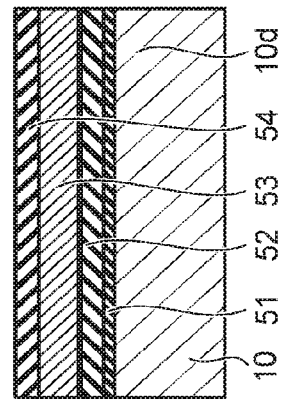

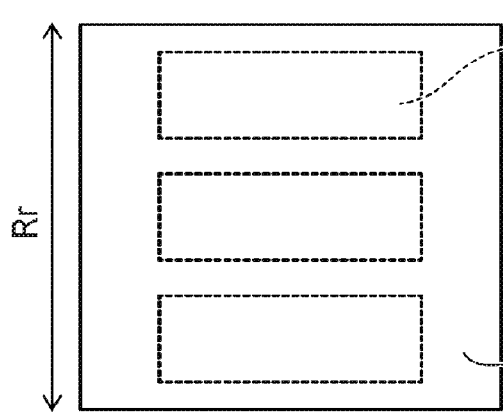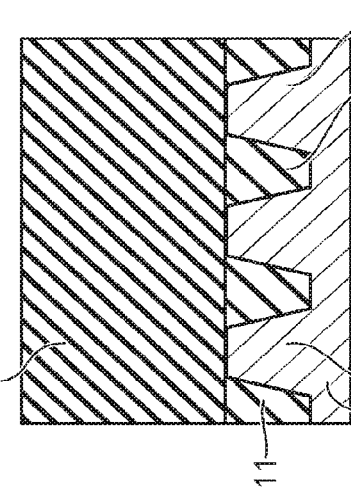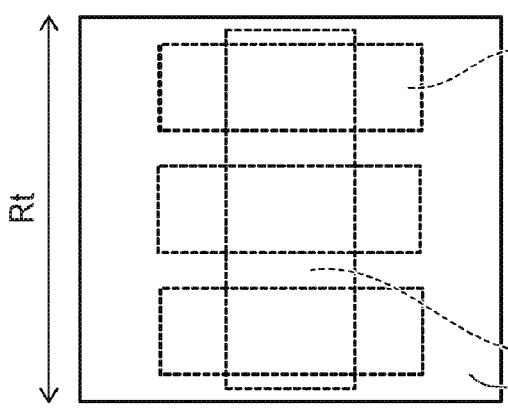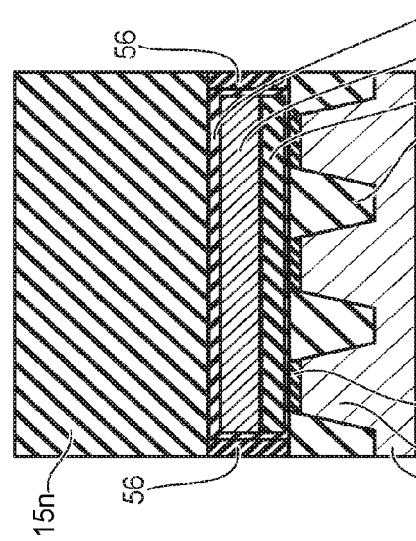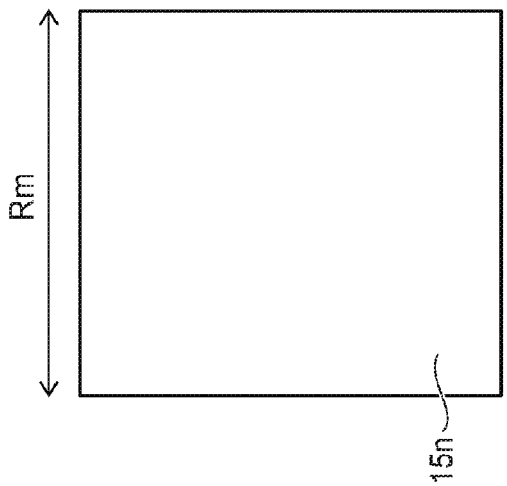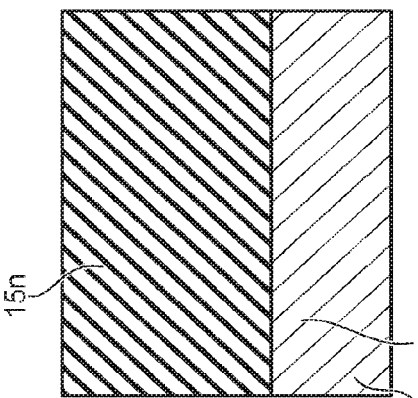

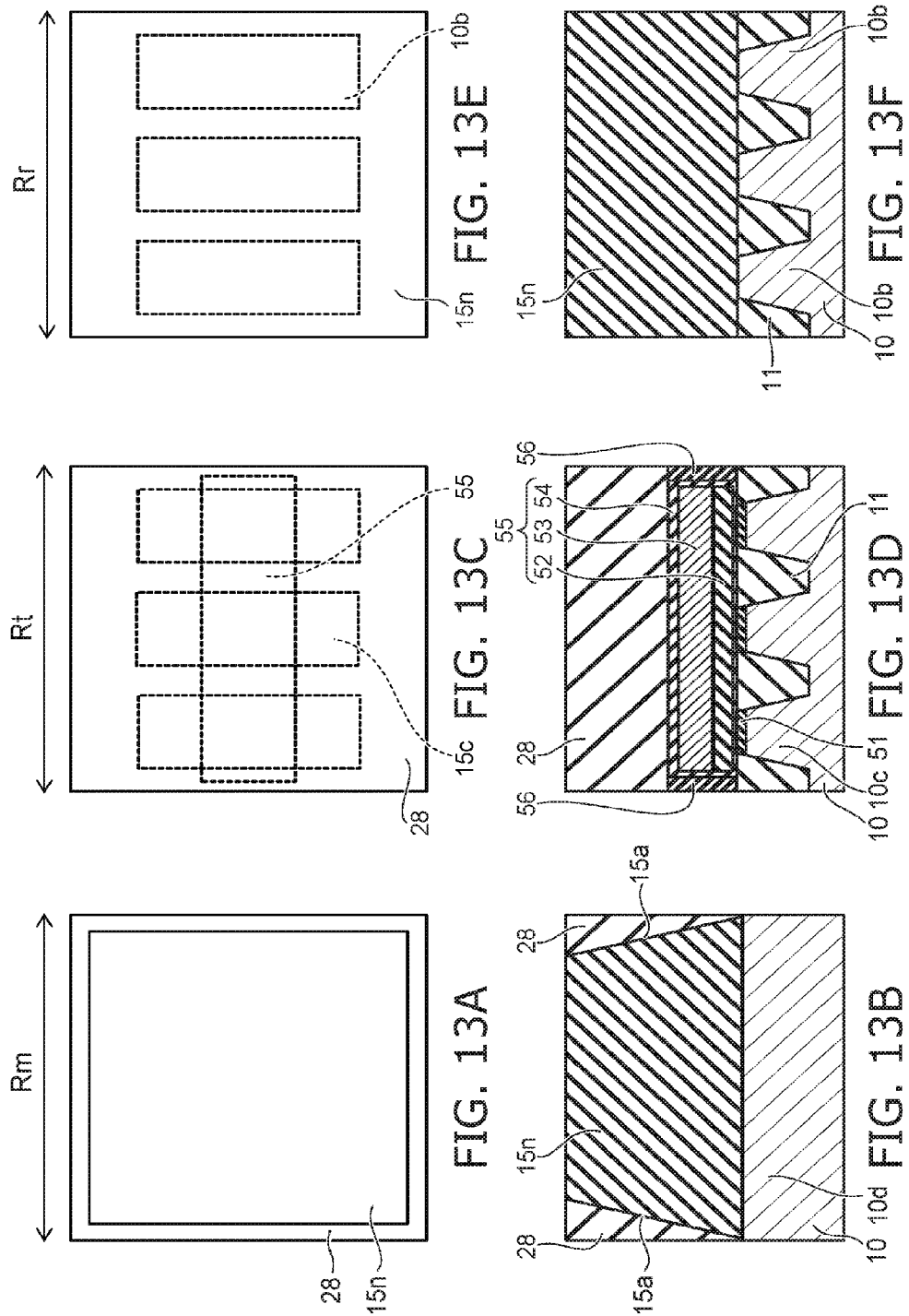

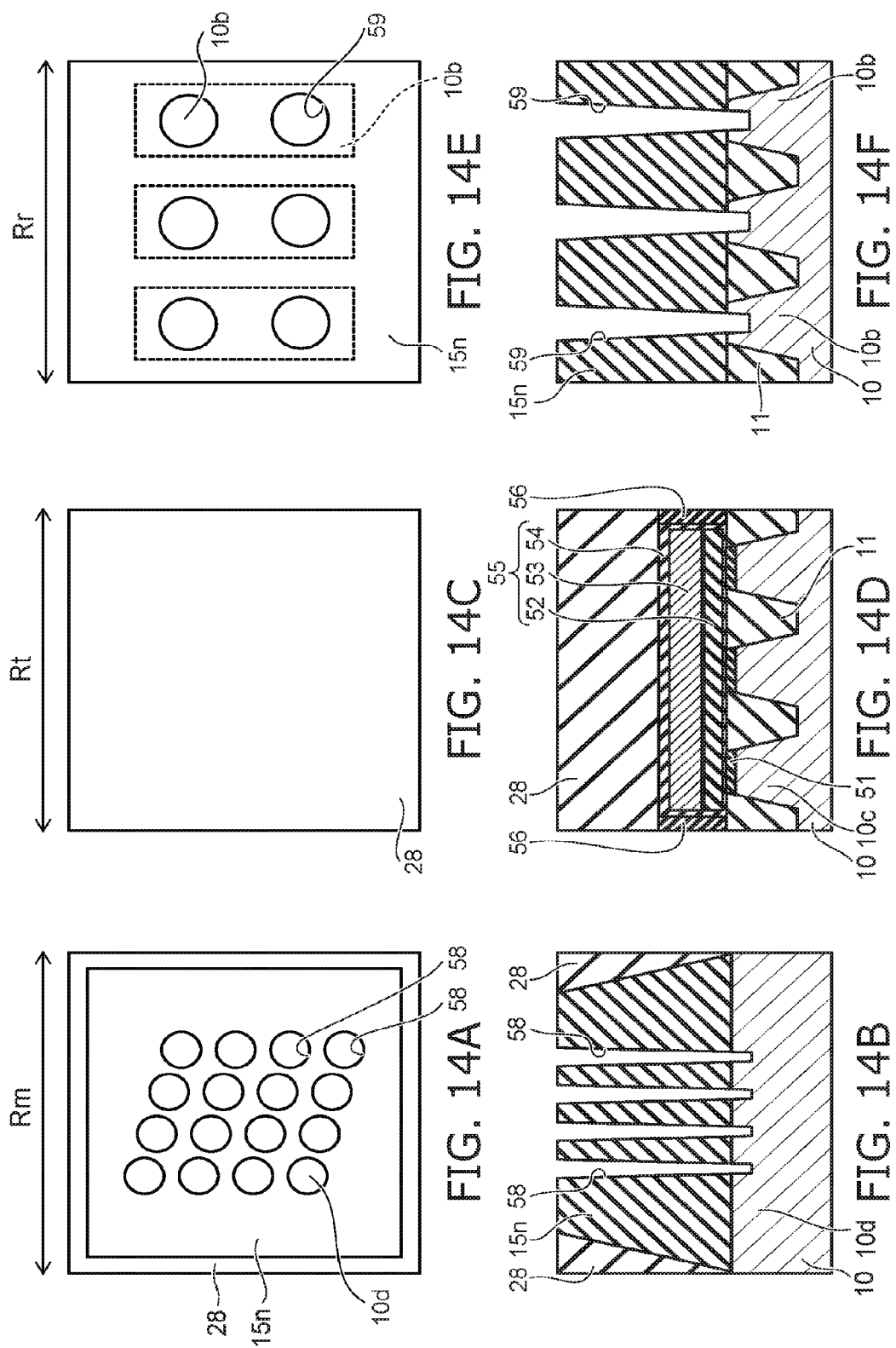

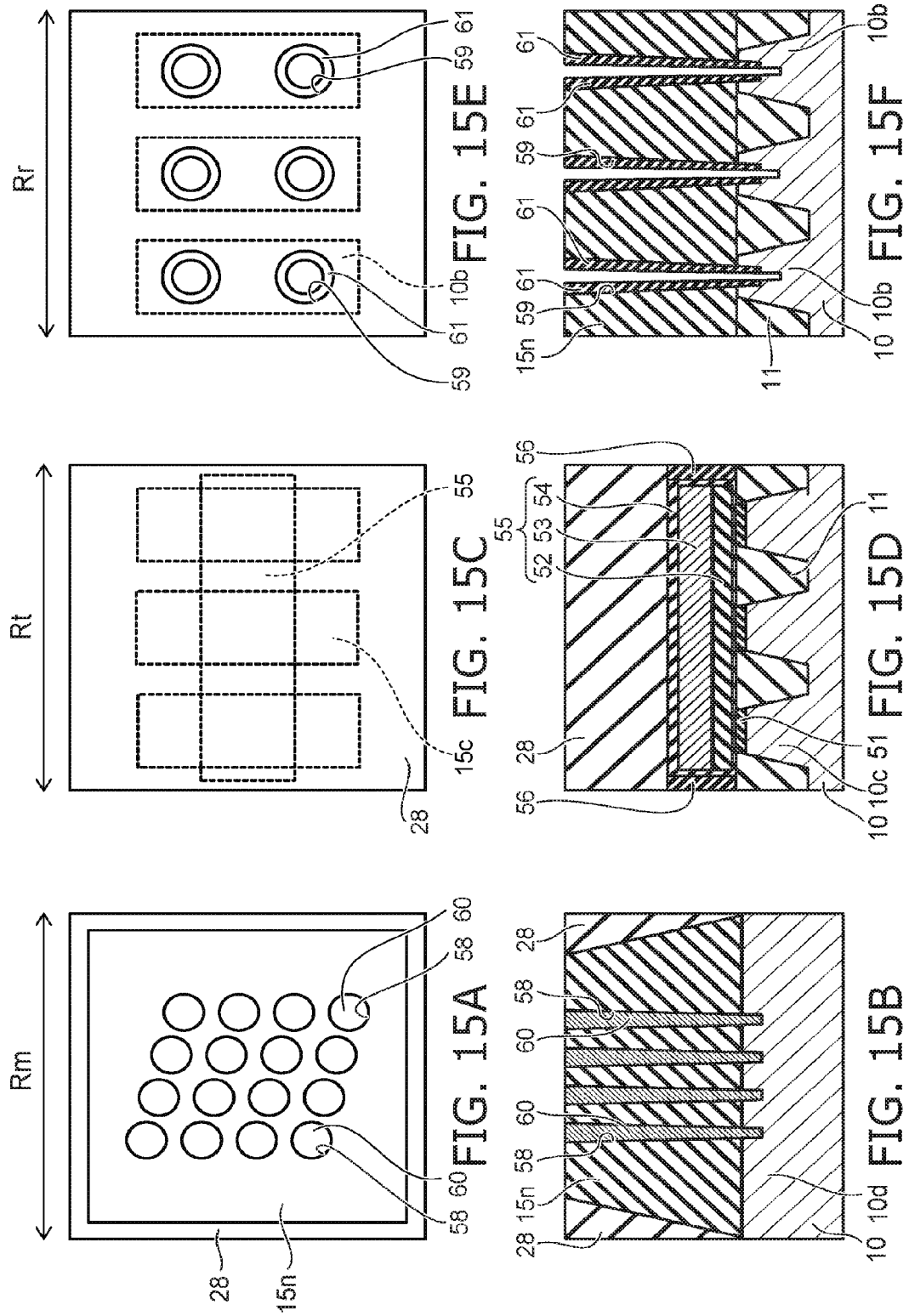

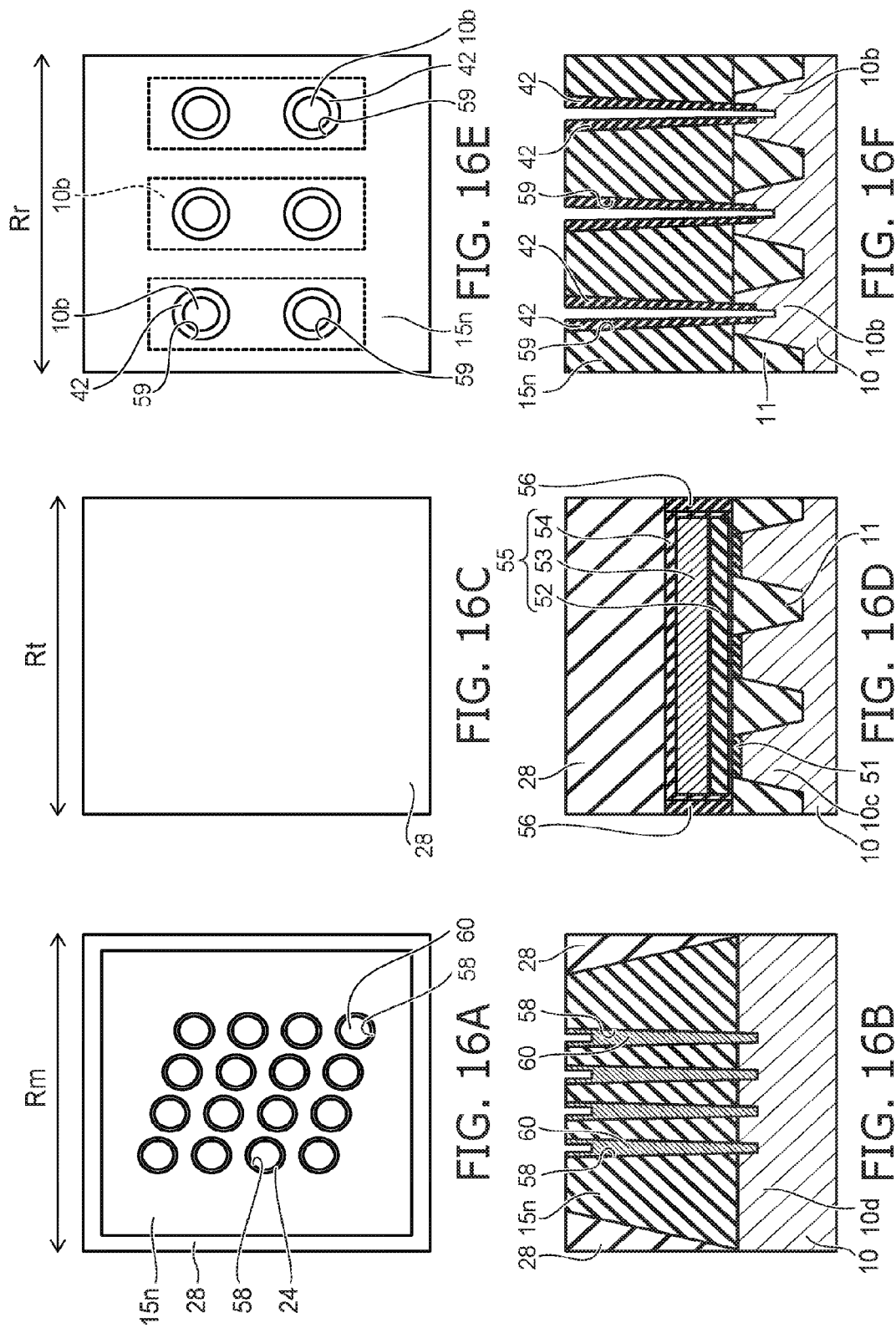

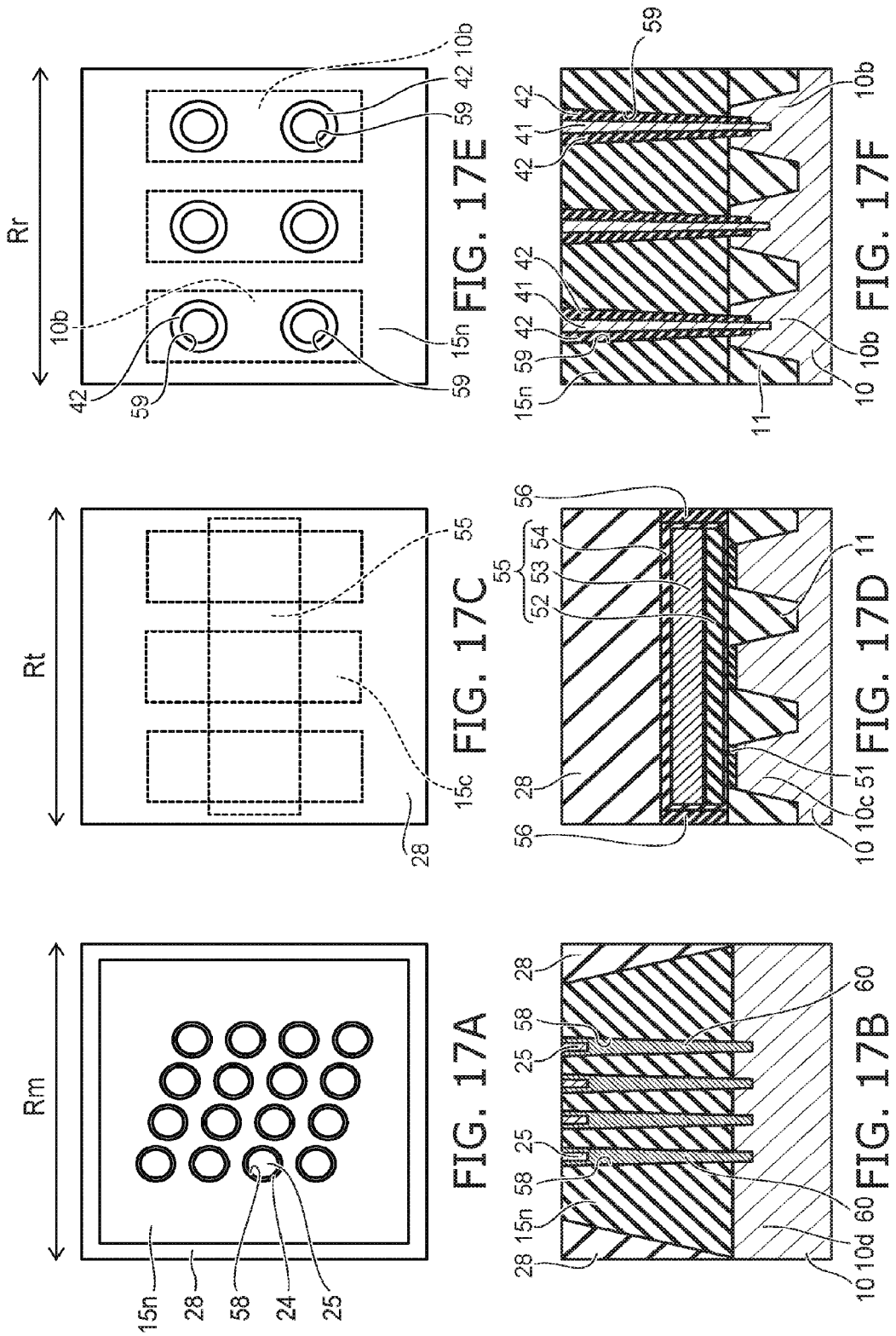

SEMICONDUCTOR DEVICE

CROSS-REFERENCE TO RELATED APPLICATIONS

This application is based upon and claims the benefit of priority from U.S. Provisional Patent Application 62/216,770, filed on Sep. 10, 2015; the entire contents of which are incorporated herein by reference.

FIELD

Embodiments relate to a semiconductor device.

BACKGROUND

In recent years, a stacked type semiconductor memory device has been proposed in which memory cells are integrated three-dimensionally. In such a stacked type semiconductor memory device, a stacked body in which electrode films and insulating films are stacked alternately is provided on a semiconductor substrate; and semiconductor pillars that pierce the stacked body are provided. Then, memory cells are formed at each intersection between the electrode films and the semiconductor pillars. Also, a drive circuit for driving the memory cells also is provided on the same semiconductor substrate.

BRIEF DESCRIPTION OF THE DRAWINGS

FIG. 3A is a plan view; FIG. 3B is a cross-sectional view along line A-A' of FIG. 3A; and FIG. 3C is a plan view showing region B of FIG. 3A;

FIG. 5A to FIG. 17F are drawings showing a method for manufacturing a semiconductor device according to a second embodiment;

DETAILED DESCRIPTION

A semiconductor device according to an embodiment includes: a semiconductor substrate, a first portion and a second portion of an upper layer portion of the semiconductor substrate being conductive; an insulating member provided on the semiconductor substrate, the insulating member electrically isolating the first portion from the second portion; a first stacked body provided in a region directly above the second portion of the semiconductor substrate, the first stacked body including a plurality of first insulating films and a plurality of electrode films, each of the first insulating films and each of the electrode films being stacked alternately; a semiconductor pillar provided inside the first stacked body, the semiconductor pillar extending in a stacking direction of the first insulating films and the electrode films; a charge storage film provided between the semiconductor pillar and the electrode films; a second stacked body provided in a region directly above the first portion of the semiconductor substrate, the second stacked body including a plurality of second insulating films and a plurality of third insulating films, each of the second insulating films and each of the third insulating films being stacked alternately; and two first conductive pillars provided inside the second stacked body, the two first conductive pillars extending in the stacking direction, lower ends of the two first conductive pillars being connected to the first portion.

Embodiments of the invention will now be described with reference to the drawings.

First Embodiment

First, a first embodiment will be described.

Figure 1:
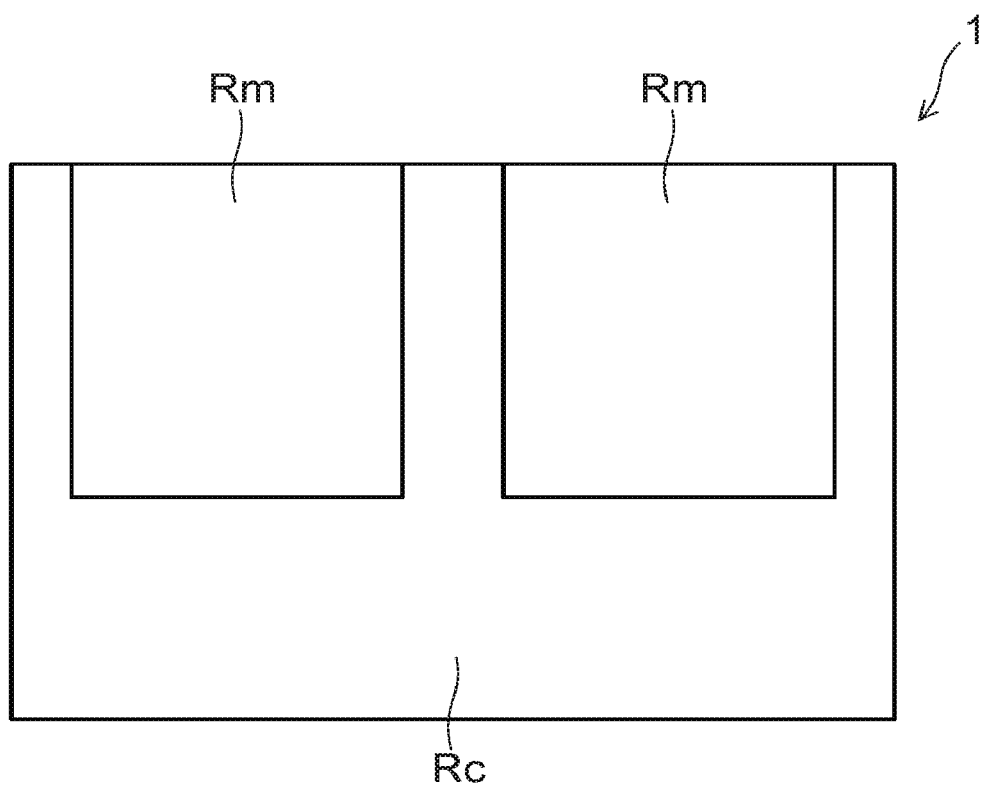
FIG. 1 is a plan view showing a semiconductor device according to a first embodiment.

FIG. 1 is a plan view showing a semiconductor device according to the embodiment.

Figure 2A:
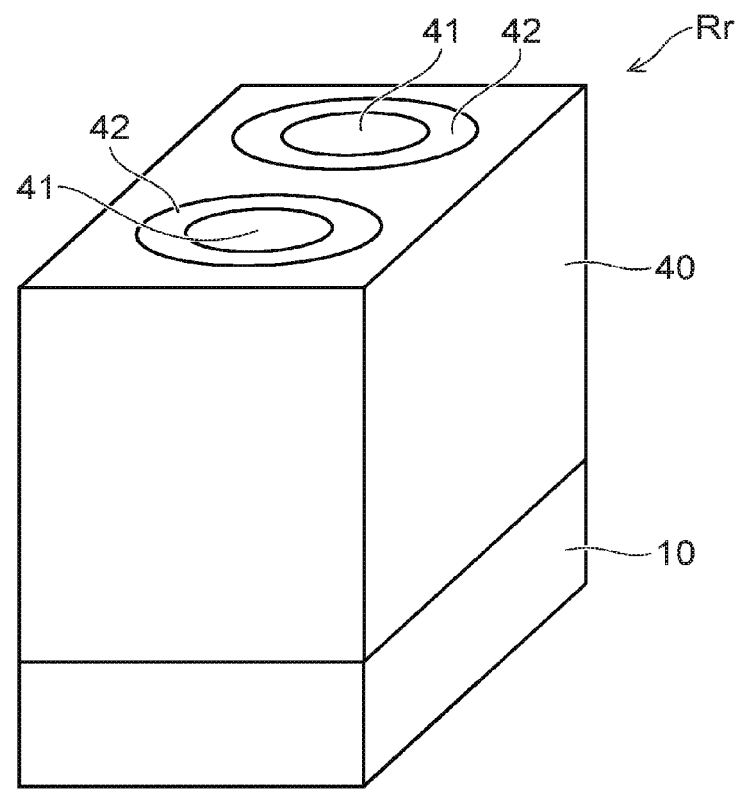
FIG. 2A is a perspective view showing a resistance element of the semiconductor device according to the first embodiment.
Figure 2B:
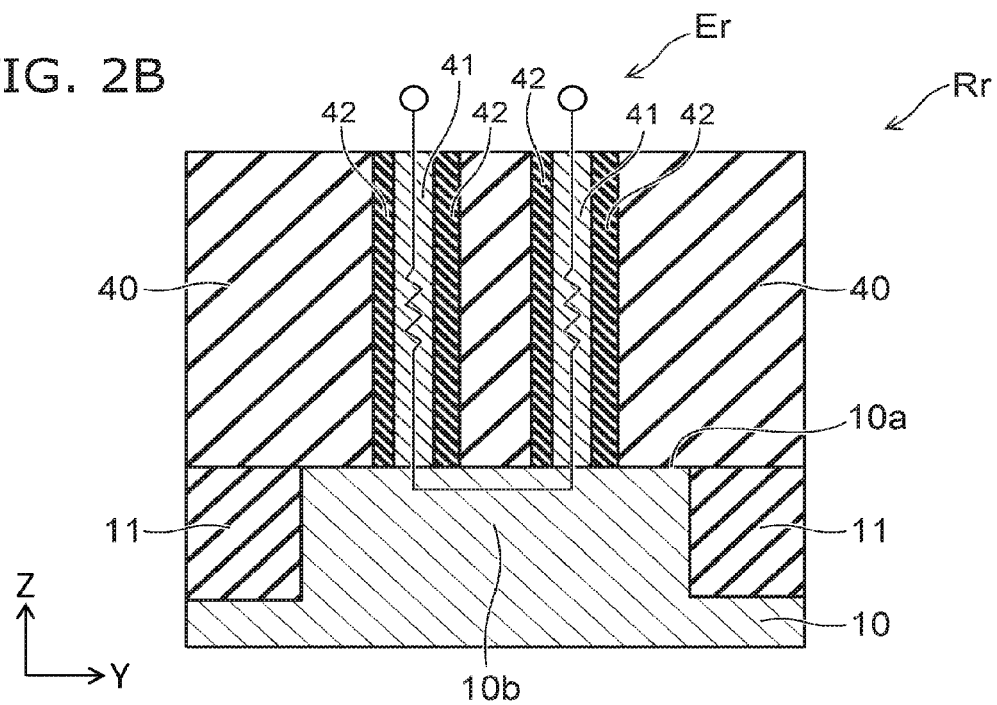
FIG. 2B is a schematic cross-sectional view.

FIG. 2A is a perspective view showing a resistance element of the semiconductor device according to the embodiment; and FIG. 2B is a schematic cross-sectional view.

As shown in FIG. 1, a memory array region Rm in which many memory cells are integrated and a peripheral circuit region Rc in which a drive circuit that programs, reads, and erases data to and from the memory cells is formed are provided in the semiconductor device 1 according to the embodiment. An interconnect draw-out region Rd for drawing out word lines from the memory cells is provided between the memory array region Rm and the peripheral circuit region Rc (referring to FIG. 4). Also, a resistor region Rr in which resistors of the drive circuit are formed (referring to FIG. 17F) and a transistor region Rt in which transistors are formed (referring to FIG. 17D) are provided in the peripheral circuit region Rc.

As shown in FIG. 2A, a silicon substrate 10 is provided in the semiconductor device 1. For example, the silicon substrate 10 is formed of monocrystalline silicon (Si). A thick stacked film 40 is provided on the silicon substrate 10. The thickness of the stacked film 40 is, for example, several μm (microns).

Hereinbelow, an XYZ orthogonal coordinate system is employed for convenience of description in the specification. Two mutually-orthogonal directions parallel to an upper surface 10a of the silicon substrate 10 are taken as an "X-direction" and a "Y-direction;" and a direction perpendicular to the upper surface 10a of the silicon substrate 10 is taken as a "Z-direction."

First, one resistance element will be described.

As shown in FIG. 2A and FIG. 2B, two conductive pillars 41 that extend in the Z-direction and pierce the stacked film 40 are provided in the resistor region Rr. The conductive pillars 41 are formed of a conductive material, e.g., silicon including an impurity. The configurations of the conductive pillars 41 are, for example, circular columns. The lower ends of the conductive pillars 41 are connected to the silicon substrate 10. Stacked films 42 are provided around the conductive pillars 41. The configurations of the stacked films 42 are circular tubes extending in the Z-direction; and the stacked films 42 are insulative in the film thickness direction. The configurations of the stacked films 40 and 42 are described below.

Also, an upper layer portion 10b which is the portion of the silicon substrate 10 to which the lower ends of the two conductive pillars 41 are connected contains an impurity and is conductive. For example, STI (Shallow Trench Isolation) 11 that is made of silicon oxide is provided as an insulating member around the portion 10b. The lower end of the STI 11 is positioned lower than the lower end of the portion 10b. Therefore, the STI 11 electrically isolates the portion 10b from the other portions of the silicon substrate 10.

Thereby, by connecting terminals respectively to the upper ends of the two conductive pillars 41 as shown in FIG. 2B, a current path is formed between the terminals in which one of the conductive pillars 41, the portion 10b of the silicon substrate 10, and the other of the conductive pillars 41 are connected in series. Then, the electrical resistance in the current path occurs mainly due to the two conductive pillars 41. Thus, a resistance element Er includes the two conductive pillars 41 and the portion 10b connected between the two conductive pillars 41. Because the resistance element Er includes the conductive pillars 41 in which the major current path extends in the Z-direction, the surface area occupied in the XY plane is small. Therefore, the resistance value per unit surface area can be set to be high.

An example in which multiple resistance elements are connected in series will now be described.

Figure 3A:
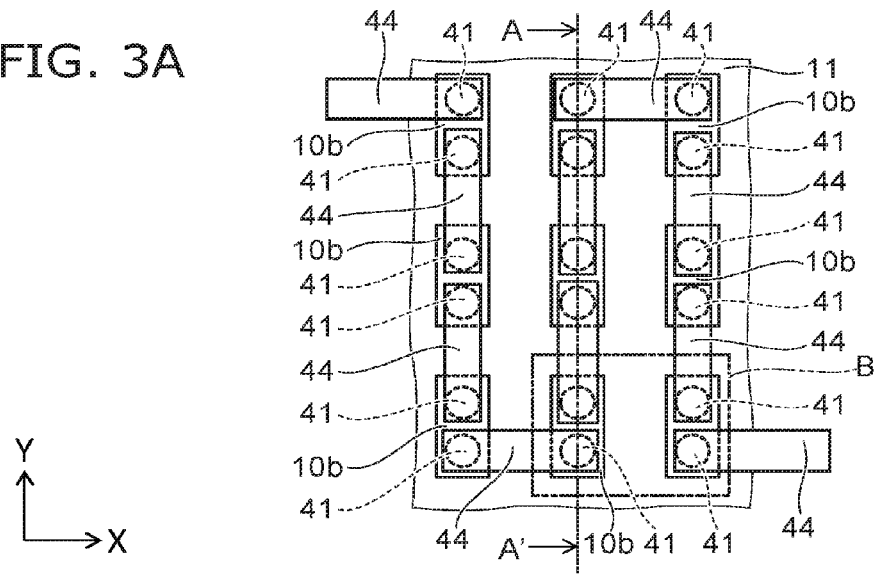
FIG. 3A to FIG. 3C are drawings showing multiple resistance elements connected in series in the semiconductor device according to the first embodiment.
Figure 3B:
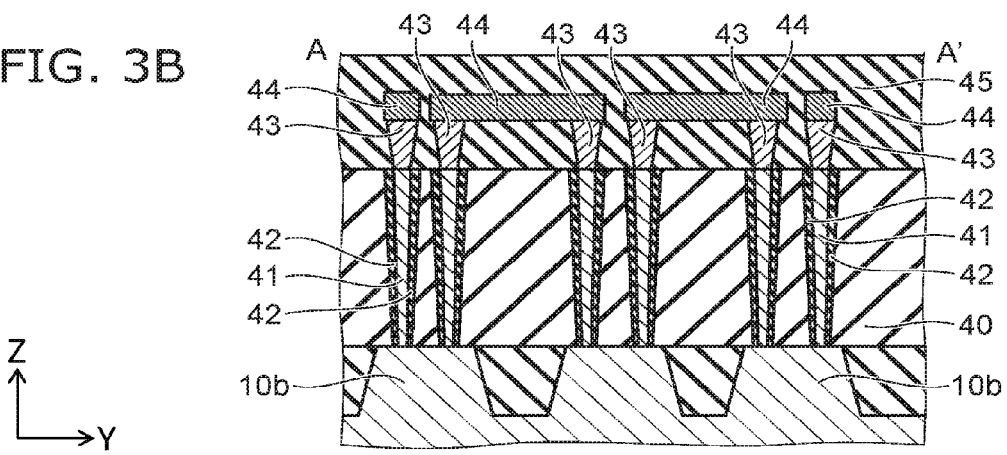
Figure 3C:
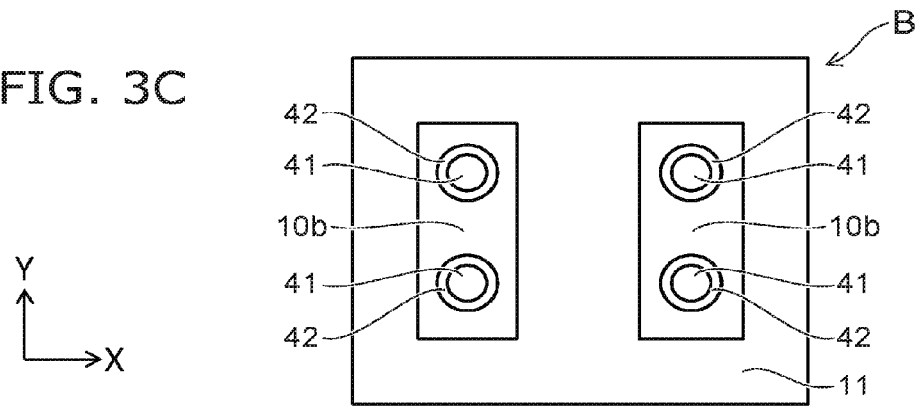

FIG. 3A to FIG. 3C are drawings showing multiple resistance elements connected in series in the semiconductor device according to the embodiment; FIG. 3A is a plan view; FIG. 3B is a cross-sectional view along line A-A' of FIG. 3A; and FIG. 3C is a plan view showing region B of FIG. 3A.

The stacked film 40, the stacked films 42, plugs 43, and an insulating film 45 are not shown in FIG. 3A. Also, the stacked film 40, the plugs 43, interconnects 44, and the insulating film 45 are not shown in FIG. 3C.

As shown in FIG. 3A, the configuration as viewed from the Z-direction of the STI 11 is a lattice configuration that partitions the multiple portions 10b into a matrix configuration. The two conductive pillars 41 are provided in the region directly above each of the portions 10b; and the lower ends of the two conductive pillars 41 are connected to the portion 10b.

Also, the plugs 43 are provided on the conductive pillars 41; and the interconnects 44 are provided on the plugs 43. The upper ends of the conductive pillars 41 are connected to the interconnects 44 via the plugs 43. The insulating film 45 is provided on the stacked film 40; and the insulating film 45 covers the plugs 43 and the interconnects 44.

Also, one of the two conductive pillars 41 connected to one of the portions 10b is connected via the plug 43, the interconnect 44, and the plug 43 to one of the two conductive pillars 41 connected to the adjacent portion 10b. Thereby, the multiple resistance elements Er are connected in series via the interconnects 44. Thus, the desired resistance value can be obtained by connecting any number of resistance elements Er.

The detailed configuration of the semiconductor device 1 will now be described.

The semiconductor device according to the embodiment is a stacked semiconductor memory device, e.g., three-dimensional NAND flash memory.

Figure 4:
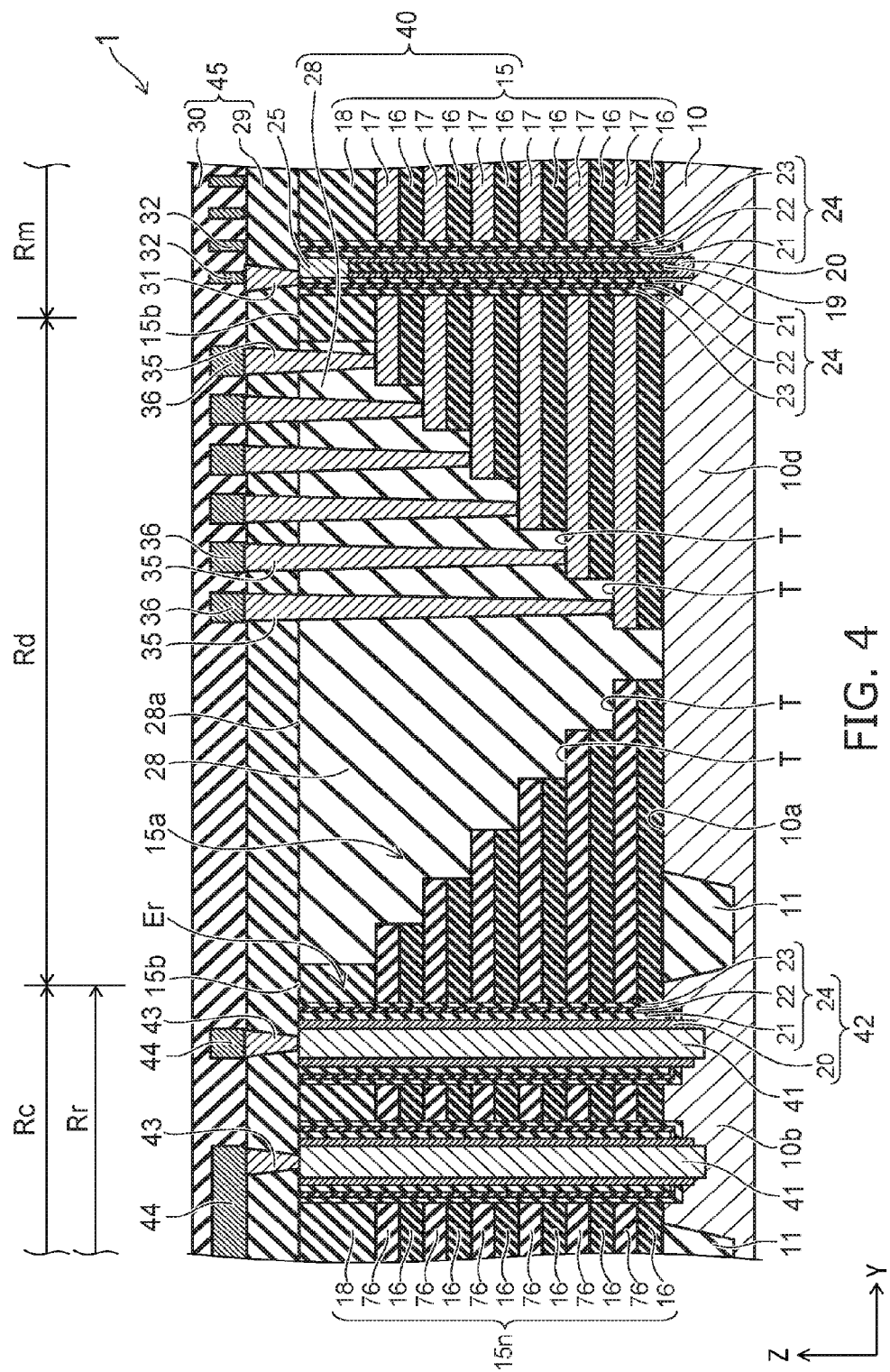
FIG. 4 is a cross-sectional view showing the semiconductor device according to the first embodiment.

FIG. 4 is a cross-sectional view showing the semiconductor device according to the embodiment.

As shown in FIG. 4, the STI 11 is provided as an insulating member on the silicon substrate 10; and the portions of the upper layer portion of the silicon substrate 10 surrounded with the STI 11, e.g., the portions 10b, portions 10c (referring to FIG. 5D), and a portion 10d are electrically isolated from each other. The portions 10b, 10c, and 10d contain an impurity and are conductive.

A stacked body 15 and a stacked body 15n are provided on the silicon substrate 10 and the STI 11. The stacked body 15 is disposed in the memory array region Rm; and the stacked body 15n is disposed in the peripheral circuit region Rc. The resistor region Rr is provided inside the peripheral circuit region Rc.

In the stacked body 15, electrode films 17 and insulative silicon oxide films 16 are stacked alternately along the Z-direction; and a silicon oxide film 18 that is insulative is provided at the uppermost layer. For example, the electrode films 17 are formed of a conductive material such as tungsten, polysilicon, etc. On the other hand, in the stacked body 15n, the silicon oxide films 16 and insulative silicon nitride films 76 are stacked alternately; and the silicon oxide film 18 is provided at the uppermost layer. The thickness and composition of the silicon oxide film 16 inside the stacked body 15 provided in the memory array region Rm respectively are the same as the thickness and composition of the silicon oxide film 16 inside the stacked body 15n provided in the resistor region Rr. Also, the thickness of the electrode film 17 inside the stacked body 15 is equal to the thickness of the silicon nitride film 76 inside the stacked body 15n.

In the interconnect draw-out region Rd, a recess 15a having a valley-like configuration extending in the X-direction is made between the stacked body 15 and the stacked body 15n. The stacked body 15 and the stacked body 15n are separated from each other by the recess 15a. The configuration of the side surface of the recess 15a on the stacked body 15 side is a stairstep configuration in which a terrace T is formed for each pair made of one silicon oxide film 16 and one electrode film 17. The configuration of the side surface of the recess 15a on the stacked body 15n side is a stairstep configuration in which the terrace T is formed for each pair made of one silicon oxide film 16 and one silicon nitride film 76. An inter-layer insulating film 28 that is made of, for example, silicon oxide is provided inside the recess 15a of the stacked body 15. In the Z-direction, the position of an upper surface 15b of the stacked body 15, the position of the upper surface 15b of the stacked body 15n, and the position of an upper surface 28a of the inter-layer insulating film 28 are the same. The stacked film 40 includes the stacked body 15, the stacked body 15n, and the inter-layer insulating film 28. An insulating film 29 is provided on the stacked film 40; and an insulating film 30 is provided on the insulating film 29. The insulating film 45 includes the insulating film 29 and the insulating film 30.

Also, a source electrode (not shown) having a plate configuration is provided inside the stacked body 15. The source electrode pierces the stacked body 15 in the Z-direction and extends in the Y-direction. The lower end of the source electrode is connected to the silicon substrate 10. Insulating plates that are made of, for example, silicon oxide are provided on the two side surfaces of the source electrode.

The memory array region Rm will now be described.

In the memory array region Rm, a silicon pillar 20 that extends in the Z-direction is multiply provided in the region directly above the portion 10d inside the stacked body 15. The silicon pillar 20 is made of, for example, polysilicon; and the configuration of the silicon pillar 20 is a circular tube in which the lower end is plugged. The lower end of the silicon pillar 20 is connected to the silicon substrate 10. A core member 19 that is made of, for example, silicon oxide is provided inside the silicon pillar 20. The silicon pillar 20 covers the side surface and lower surface of the core member 19. The core member 19 may not be provided. A silicon plug 25 that is made of silicon is provided on the silicon pillar 20 and the core member 19. The silicon plug 25 is made of silicon including an impurity; and the impurity is, for example, at least one type of element selected from the group consisting of arsenic (As), phosphorus (P), boron (B), and gallium (Ga).

A tunneling insulating film 21 is provided on the side surfaces of the silicon pillar 20 and the silicon plug 25. Although the tunneling insulating film 21 normally is insulative, the tunneling insulating film 21 is a film in which a tunneling current flows when a prescribed voltage within the range of the drive voltage of the semiconductor device 1 is applied. The tunneling insulating film 21 is, for example, a single-layer silicon oxide film or an ONO film in which a silicon oxide layer, a silicon nitride layer, and a silicon oxide layer are stacked in this order.

A charge storage film 22 is provided on the surface of the tunneling insulating film 21. The charge storage film 22 is a film that can store charge, is formed of a material having trap sites of electrons, and is formed of, for example, silicon nitride (SiN).

A blocking insulating film 23 is provided on the surface of the charge storage film 22. The blocking insulating film 23 is a film in which a current substantially does not flow even when a voltage within the range of the drive voltage of the semiconductor device 1 is applied. The blocking insulating film 23 is, for example, a multilayer film in which a silicon oxide layer and an aluminum oxide layer are stacked. A memory film 24 that is capable of storing data includes the tunneling insulating film 21, the charge storage film 22, and the blocking insulating film 23. Accordingly, the memory film 24 is disposed between the silicon pillar 20 and the electrode films 17. Memory cell transistors are configured, with the memory film 24 interposed, at each intersection between the silicon pillar 20 and the electrode films 17.

A metal plug 31 is provided inside the insulating film 29. A bit line 32 that extends in the X-direction is provided inside the insulating film 30. The bit line 32 is connected to the upper end of the silicon pillar 20 via the metal plug 31 and the silicon plug 25.

Thus, the silicon pillar 20 is connected between the bit line 32 and the silicon substrate 10. Also, a NAND string is formed by connecting multiple memory cell transistors in series along each of the silicon pillars 20. Thereby, in the memory array region Rm, the multiple memory cell transistors are arranged in a three-dimensional matrix configuration.

The interconnect draw-out region Rd will now be described.

In the interconnect draw-out region Rd, contacts 35 that extend in the Z-direction and pierce the insulating film 29 and the inter-layer insulating film 28 are provided. The lower end of the contact 35 is connected to the electrode film 17 included in each of the terraces T. Interconnects 36 are provided inside the insulating film 30 and are connected to the upper ends of the contacts 35.

The resistor region Rr will now be described.

In the resistor region Rr, the conductive pillar 41 that extends in the Z-direction to pierce the stacked body 15n is multiply provided. As described above, the conductive pillar 41 is formed of silicon including an impurity; and the configuration of the conductive pillar 41 is a circular column into which silicon is filled to the center. The composition of the conductive pillar 41 is the same as the composition of the silicon plug 25. The conductive pillar 41 is disposed in the region directly above the portion 10b of the silicon substrate 10; and the lower ends of two conductive pillars 41 are connected to one portion 10b. The stacked film 42 in which the silicon pillar 20 and the memory film 24 are stacked in this order is provided on the side surface of the conductive pillar 41. The film configuration of the memory film 24 inside the stacked film 42 is the same as the film configuration of the memory film 24 in the memory array region Rm. In other words, the tunneling insulating film 21, the charge storage film 22, and the blocking insulating film 23 are stacked in this order. The outer diameter of the conductive pillar 41 in the resistor region Rr is larger than the outer diameter of the silicon pillar 20 in the memory array region Rm.

The plugs 43 are provided inside the insulating film 29; and the lower ends of the plugs 43 are connected to the upper ends of the conductive pillars 41. The interconnects 44 are provided inside the insulating film 30 and are connected to the upper ends of the plugs 43. Also, the STI 11 is provided around the portion 10b of the silicon substrate 10 to which the two conductive pillars 41 are connected and electrically isolates the portion 10b from the other portions of the silicon substrate 10. Thereby, the resistance element Er is formed of the two conductive pillars 41 and the portion 10b connected between the two conductive pillars 41.

Effects of the embodiment will now be described.

According to the embodiment, the conductive pillars 41 that extend in the Z-direction can be formed by utilizing the stacked body 15n that is formed in the same process as the stacked body 15 for arranging the memory cell transistors along the Z-direction. Thereby, because the greater part of the current path extends in the Z-direction, the resistance element Er that has a high resistance value per unit surface area in the XY plane can be realized. As a result, the resistor region Rr of the semiconductor device 1 is reduced; and a smaller semiconductor device 1 can be realized.

Second Embodiment

A second embodiment will now be described.

The embodiment is an embodiment of a method for manufacturing the semiconductor device. The semiconductor device manufactured according to the embodiment corresponds roughly to the semiconductor device 1 according to the first embodiment described above.

FIG. 5A to FIG. 17F are drawings showing the method for manufacturing the semiconductor device according to the embodiment.

Figure 5A:
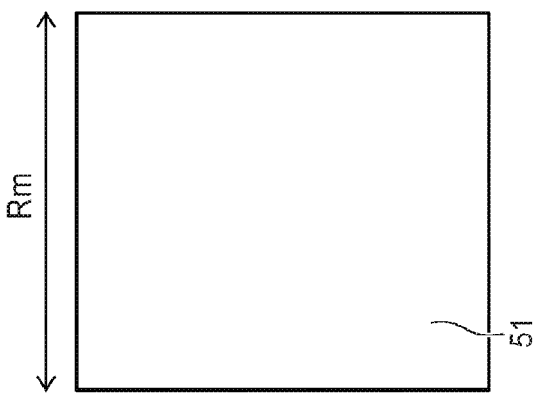
Figure 5B:
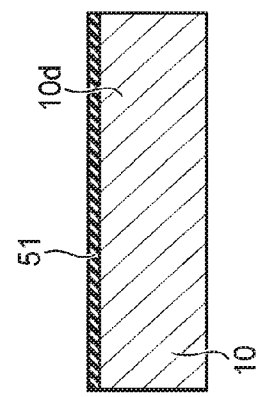
Figure 5C:
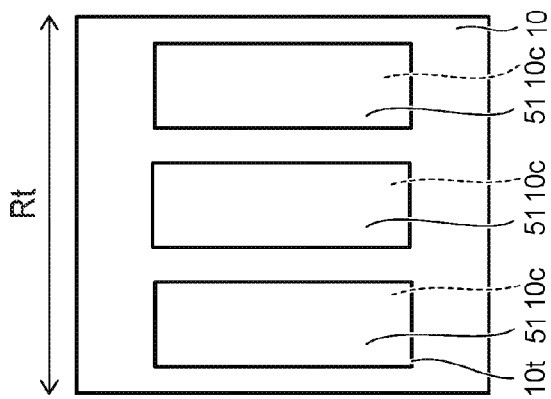
Figure 5D:
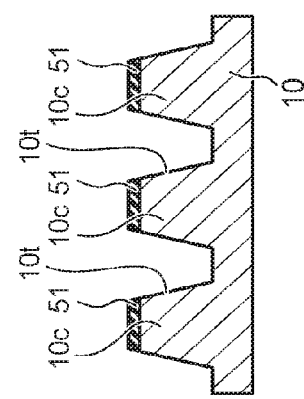
Figure 5E:
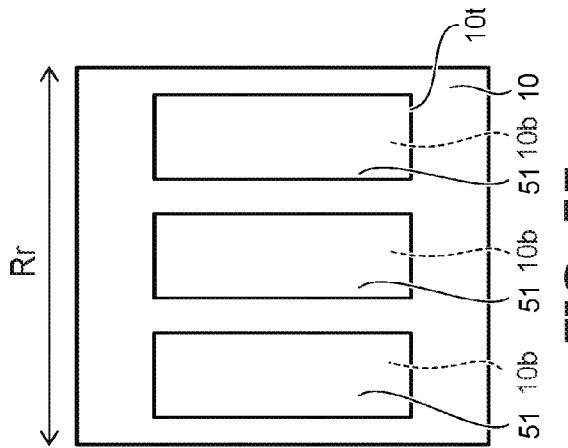
Figure 5F:
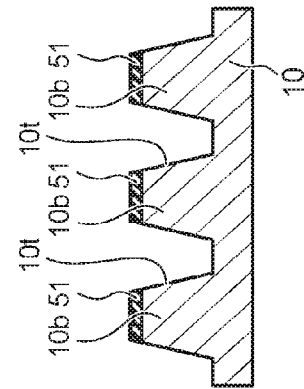
Figure 6C:
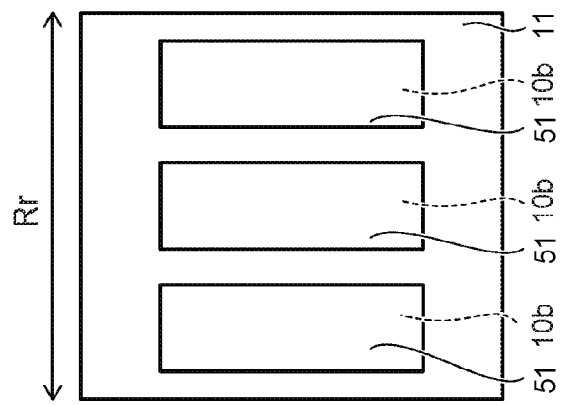
Figure 6D:
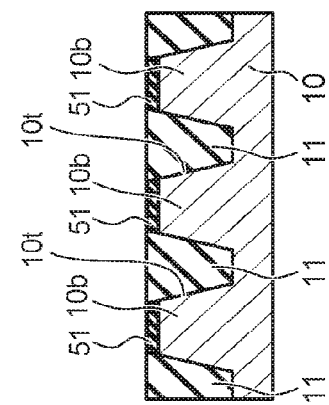
Figure 6E:
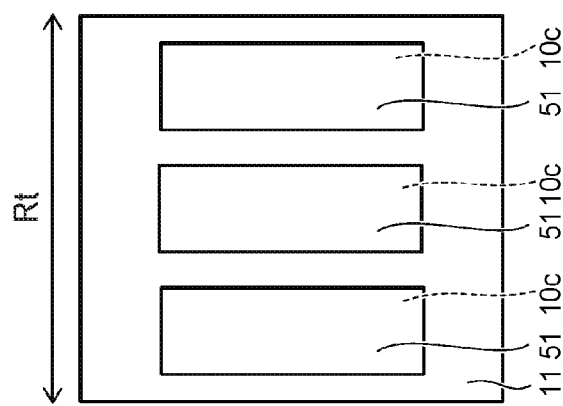
Figure 6F:
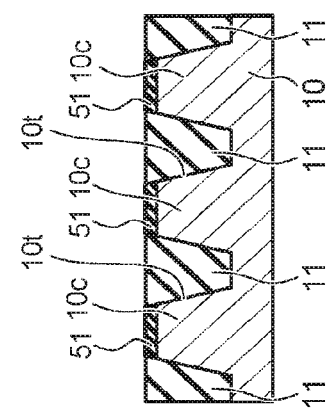
Figure 6A:
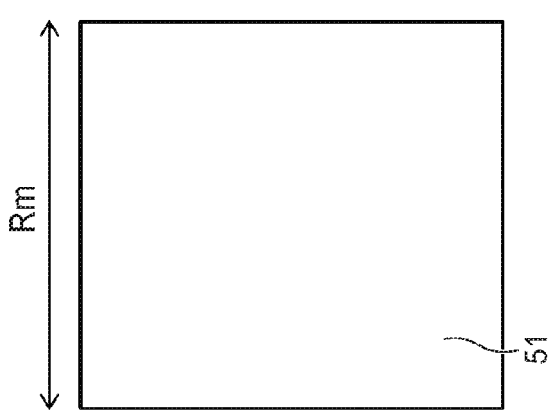
Figure 6B:
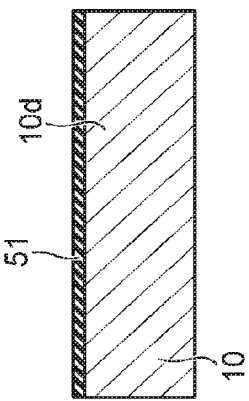
Figure 10E:
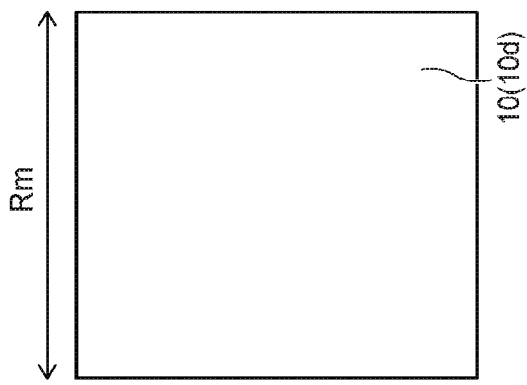
Figure 10F:
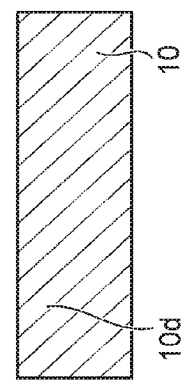
Figure 10C:
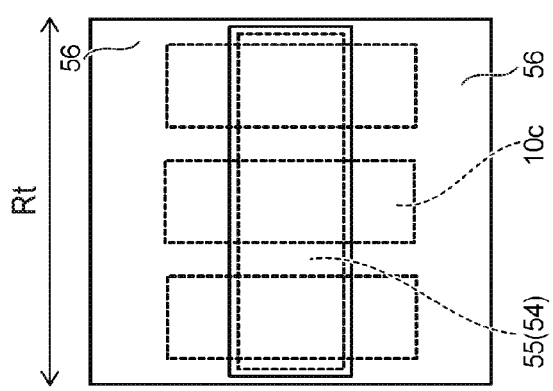
Figure 10D:
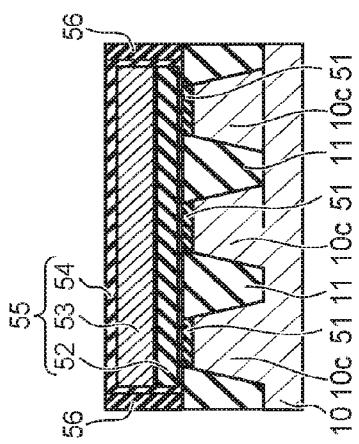
Figure 10A:
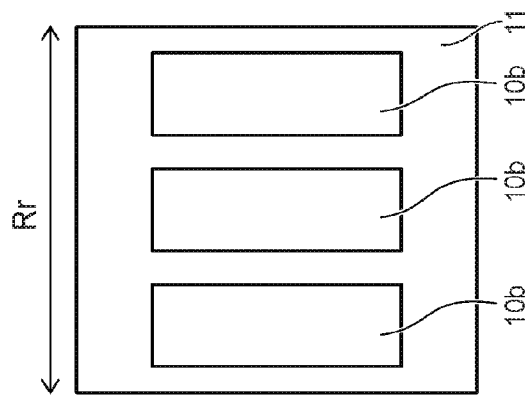
Figure 10B:
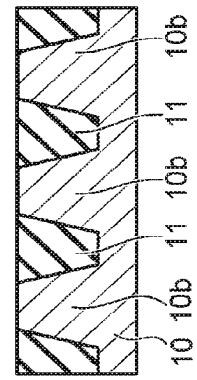

FIG. 5A is a plan view showing the memory array region; and FIG. 5B is a cross-sectional view showing the memory array region. FIG. 5C is a plan view showing the transistor region; and FIG. 5D is a cross-sectional view showing the transistor region. FIG. 5E is a plan view showing the resistor region; and FIG. 5F is a cross-sectional view showing the resistor region. This is similar for FIG. 6A to FIG. 17F as well.

First, the silicon substrate 10 is prepared as shown in FIG. 5A to FIG. 5F.

Then, a silicon oxide film 51 is formed on the upper surface of the silicon substrate 10. In the memory array region Rm and the resistor region Rr, a thin silicon oxide film for low-voltage transistors is formed; and in the transistor region Rt, a thin silicon oxide film for low-voltage transistors or a thick silicon oxide film for high-voltage transistors is formed.

Then, in the transistor region Rt and the resistor region Rr of the peripheral circuit region Rc, trenches 10t are made in the upper surface of the silicon substrate 10. Thereby, the upper layer portion of the silicon substrate 10 is partitioned into multiple portions and electrically isolated. Specifically, the upper layer portion of the silicon substrate 10 is partitioned into the portion 10d in the memory array region Rm, partitioned into the multiple portions 10c in the transistor region Rt, and partitioned into the multiple portions 10b in the resistor region Rr. When viewed from above, the configurations of the portions 10b, 10c, and 10d are rectangles.

Then, as shown in FIG. 6A to FIG. 6F, the STI 11 is formed by filling silicon oxide into the trenches 10t.

Then, as shown in FIG. 7A to FIG. 7F, an insulating film 52 that is made of, for example, silicon oxide is formed on the silicon substrate 10 and the STI 11. Then, an electrode film 53 is formed on the insulating film 52 by forming a barrier metal layer made of tungsten nitride (WN) and by forming a main body unit made of tungsten (W).

Then, in the transistor region Rt as shown in FIG. 8A to FIG. 8F, the electrode film 53 and the insulating film 52 are selectively removed to remain to straddle the longitudinal-direction central portions of the portions 10c. Although an example is illustrated in this process in which one electrode film 53 is patterned to straddle three portions 10c (active areas), this is not limited thereto; and, for example, the electrode film 53 may be divided into three; and the electrode films 53 may respectively straddle the portions 10c.

Then, as shown in FIG. 9A to FIG. 9F, a spacer film 54 that is made of, for example, silicon nitride is formed on the entire surface. Thereby, in the transistor region Rt, the insulating film 52 and the electrode film 53 are stacked; and a gate electrode structure body 55 that is covered with the spacer film 54 is formed. Then, an inter-layer insulating film 56 that is made of, for example, silicon oxide is formed between the gate electrode structure body 55.

Then, as shown in FIG. 10A to FIG. 10F, etch-back is performed to remove the spacer film 54, the electrode film 53, the insulating film 52, and the silicon oxide film 51 in the memory array region Rm and the resistor region Rr. Thereby, the silicon substrate 10 and the STI 11 are exposed in the memory array region Rm and the resistor region Rr.

Then, as shown in FIG. 11A to FIG. 11F, the silicon oxide films 16 (referring to FIG. 4) and the silicon nitride films 76 (referring to FIG. 4) are deposited alternately on the entire surface. Then, the silicon oxide film 18 is formed. Thereby, an ONON-type stacked body 15n is formed on the silicon substrate 10. In FIG. 11A to FIG. 11F, the internal structure of the stacked body 15n is not shown for convenience of illustration.

Figure 12E:
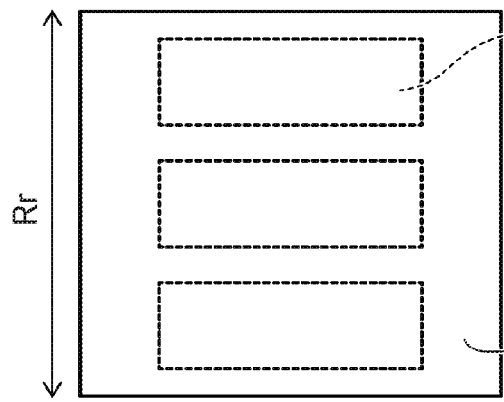
Figure 12F:
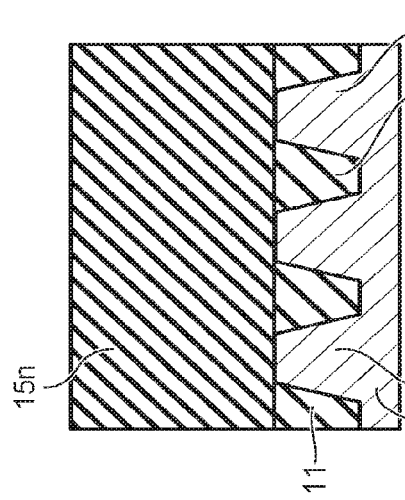
Figure 12C:
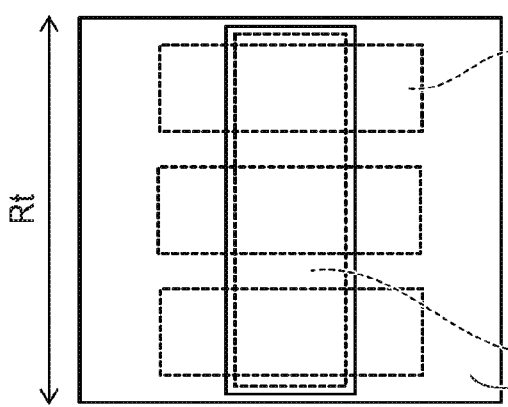
Figure 12D:
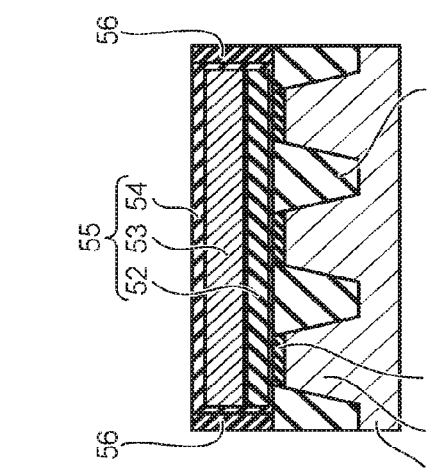
Figure 12A:
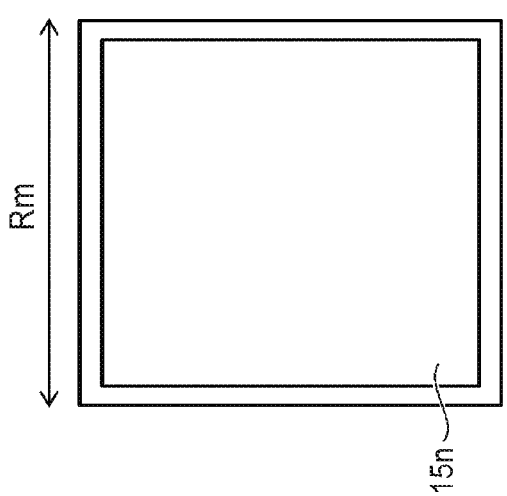
Figure 12B:
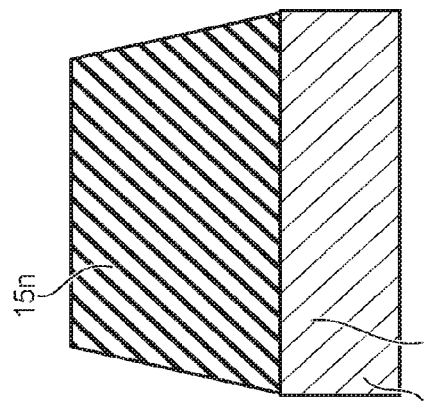

Then, as shown in FIG. 12A to FIG. 12F, a resist film (not shown) is formed in the memory array region Rm and the resistor region Rr. Then, RIE (Reactive Ion Etching) using the resist film as a mask and slimming of the resist film are implemented alternately. Thereby, the terrace T (referring to FIG. 4) is formed for each pair made of one silicon oxide film 16 and one silicon nitride film 76 in a portion of the stacked body 15n; and the portion of the stacked body 15n is patterned into a stairstep configuration. Thereby, the recess 15a that has the valley-like configuration is made in the stacked body 15n; and the stacked body 15n is divided by the recess 15a. In FIG. 12A and FIG. 12B, the stairstep configuration is not shown; and the side surface of the stacked body 15n is drawn as being an oblique surface. On the other hand, in FIG. 4, the number of stacks of silicon oxide films 16 is drawn as being less than the actual number of stacks; and the stairstep configuration is drawn as being exaggerated. Also, the stacked body 15n in the transistor region Rt is removed at this time.

Then, as shown in FIG. 13A to FIG. 13F, the inter-layer insulating film 28 is filled into the recess 15a by depositing silicon oxide on the entire surface and by planarizing the upper surface.

Then, as shown in FIG. 14A to FIG. 14F, memory holes 58 that pierce the stacked body 15n in the memory array region Rm and resistor holes 59 that pierce the stacked body 15n in the resistor region Rr are made by lithography and RIE. At this time, the lower ends of the memory holes 58 penetrate the portion 10d of the silicon substrate 10. Also, the lower ends of the resistor holes 59 penetrate the portions 10b of the silicon substrate 10. At this time, the lower ends of two resistor holes 59 reach one portion 10b. The diameter of the resistor hole 59 is larger than the diameter of the memory hole 58.

Then, as shown in FIG. 15A to FIG. 15F, the blocking insulating film 23 (referring to FIG. 4), the charge storage film 22 (referring to FIG. 4), the tunneling insulating film 21 (referring to FIG. 4), and a cover silicon layer (not shown) are formed on the inner surfaces of the memory holes 58 and the resistor holes 59. Then, the silicon substrate 10 is exposed by performing RIE to remove the cover silicon layer, the tunneling insulating film 21, the charge storage film 22, and the blocking insulating film 23 that are on the bottom surfaces of the memory holes 58 and on the bottom surfaces of the resistor holes 59. Then, a body silicon layer (not shown) is formed on the inner surfaces of the memory holes 58 and on the inner surfaces of the resistor holes 59 to reach the silicon substrate 10. The silicon pillars 20 (referring to FIG. 4) are formed of the cover silicon layer and the body silicon layer.

Then, the core members 19 are formed by depositing silicon oxide on the inner surfaces of the memory holes 58 and on the inner surfaces of the resistor holes 59. At this time, the core members 19 inside the memory holes 58 are filled to the centers of the memory holes 58. On the other hand, because the diameter of the resistor hole 59 is larger than the diameter of the memory hole 58, the core members 19 are not filled to the centers of the resistor holes 59; and the core members 19 are formed in film-like configurations on the inner surfaces of the resistor holes 59.

Thereby, as shown in FIG. 4, the memory film 24 that is made of the blocking insulating film 23, the charge storage film 22, and the tunneling insulating film 21 is formed on the inner surface of the memory hole 58; and the silicon pillar 20 is formed on the surface of the memory film 24. The core member 19 is formed inside the silicon pillar 20. In FIG. 15A and FIG. 15B, the structure body having the columnar configuration made of the memory film 24, the silicon pillar 20, and the core member 19 is shown as a memory hole columnar body 60. On the other hand, a stacked film 61 in which the memory film 24, the silicon pillar 20, and the core member 19 are stacked in this order is formed on the inner surface of the resistor hole 59. The configuration of the stacked film 61 is a circular tube in which the lower end is sealed.

Then, as shown in FIG. 16A to FIG. 16F, for example, isotropic etching such as CDE (Chemical Dry Etching), etc., is performed. Thereby, the upper portion of the silicon pillar 20 and the upper portion of the core member 19 of the memory hole columnar body 60 in the memory array region Rm are removed. Also, the portions of the stacked film 61 in the resistor region Rr deposited on the bottom surfaces of the resistor holes 59 are removed; and the portions 10b of the silicon substrate 10 are exposed. At this time, the core member 19 that has the film-like configuration deposited on the side surface of the resistor hole 59 also is removed. Thereby, the stacked film 42 that is made of the memory film 24 and the silicon pillar 20 remains on the side surface of the resistor hole 59.

Then, as shown in FIG. 17A to FIG. 17F, silicon that contains an impurity, e.g., one of arsenic, phosphorus, boron, or gallium, is deposited; and the upper surface is planarized. Thereby, in the memory array region Rm, the silicon plug 25 is filled into the space where the silicon pillar 20 and the core member 19 are removed in the process shown in FIG. 16A to FIG. 16F. Also, in the resistor region Rr, the conductive pillar 41 is filled onto the surface of the stacked film 42 inside the resistor hole 59. The conductive pillar 41 fills the entire interior of the resistor hole 59; and the lower end of the conductive pillar 41 is connected to the portion 10b.

Then, a trench (not shown) that extends in the Y-direction (referring to FIG. 4) is made in the stacked body 15n formed in the memory array region Rm to expose the silicon substrate 10. Then, the silicon nitride films 76 (referring to FIG. 4) are removed via the trench by performing isotropic etching such as wet etching, etc. At this time, the silicon oxide films 16, the silicon oxide film 18, and the inter-layer insulating film 28 remain. The trench is not made in the stacked body 15n formed in the peripheral circuit region Rc.

Then, the electrode films 17 (referring to FIG. 4) are formed by filling a conductive material such as tungsten, etc., via the trench into the spaces where the silicon nitride films 76 were removed. Thereby, in the memory array region Rm, the silicon nitride films 76 of the stacked body 15n are replaced with the electrode films 17; and the stacked body 15 (referring to FIG. 4) is formed in which the silicon oxide films 16 and the electrode films 17 are stacked alternately and the silicon oxide film 18 is provided at the uppermost layer. The silicon nitride films 76 in the resistor region Rr are not removed and are not replaced with the electrode films 17 when performing the wet etching via the trench because the recess 15a that has the valley-like configuration and divides the stacked body 15 is provided between the memory array region Rm and the resistor region Rr. Then, insulating plates are formed on the side surfaces of the trench. Then, a source electrode is filled into the interior of the trench; and the lower end of the source electrode is connected to the silicon substrate 10.

Then, as shown in FIG. 4, the insulating film 29 is formed on the stacked body 15 and the inter-layer insulating film 28. Then, plug holes are made in the insulating film 29 in the regions directly above the silicon plugs 25 and the regions directly above the conductive pillars 41 by lithography and RIE. Also, contact holes are made in the insulating film 29 and the inter-layer insulating film 28 in the regions directly above the terraces T. Then, by filling a metal material such as tungsten, etc., into the plug holes, the metal plugs 31 are formed in the regions directly above the silicon plugs 25; and the plugs 43 are formed in the regions directly above the conductive pillars 41. Also, the contact 35 is formed in the region directly above each of the terraces T by filling the metal material such as tungsten, etc., into the contact holes. The lower end of the contact 35 is connected to the portion of the electrode film 17 included in each of the terraces T. Then, the bit lines 32, the interconnects 36, and the interconnects 44 are formed on the insulating film 29. Then, the insulating film 30 is formed to bury the bit lines 32, the interconnects 36, and the interconnects 44. Thus, the semiconductor memory device according to the embodiment is manufactured.

Effects of the embodiment will now be described.

According to the embodiment, the memory hole columnar bodies 60 and the stacked films 61 are formed simultaneously by simultaneously making the memory holes 58 and the resistor holes 59 in the process shown in FIG. 14A to FIG. 14F and by forming the memory film 24, the silicon pillar 20, and the core member 19 in the process shown in FIG. 15A to FIG. 15F; and the silicon plugs 25 and the conductive pillars 41 are formed simultaneously by depositing silicon including an impurity in the process shown in FIG. 17A to FIG. 17F. Thereby, the resistance element Er can be made by substantially the same processes as the memory cell transistors. Thus, the resistance element Er can be made without greatly increasing the number of processes. Accordingly, the process cost increase due to making the resistance element Er is not large.

Also, according to the embodiment, the resistance value of the conductive pillar 41 can be controlled by the diameter of the resistor hole 59.

Further, in the embodiment, the stacked body 15n is provided in the memory array region Rm and the resistor region Rr in the process shown in FIG. 13A to FIG. 13F; and the planarization of the inter-layer insulating film 28 is easy because the stacked body 15n functions as a stopper.

Third Embodiment

A third embodiment will now be described.

Figure 18A:
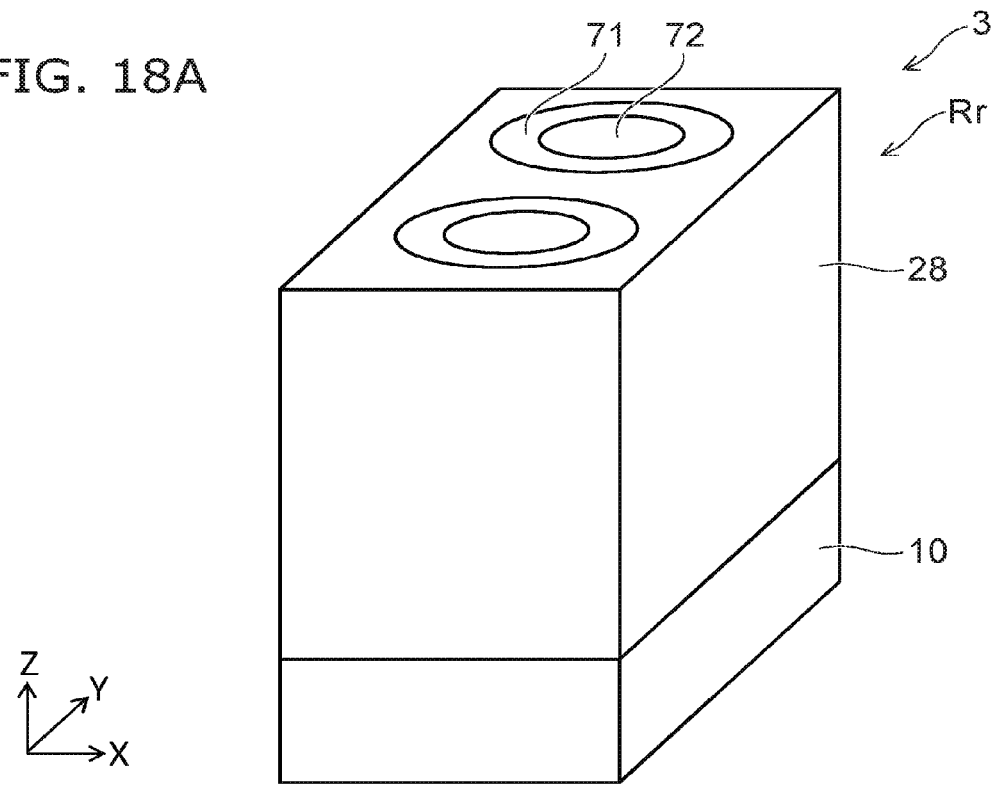
FIG. 18A is a perspective view showing a resistance element of a semiconductor device according to a third embodiment.
Figure 18B:
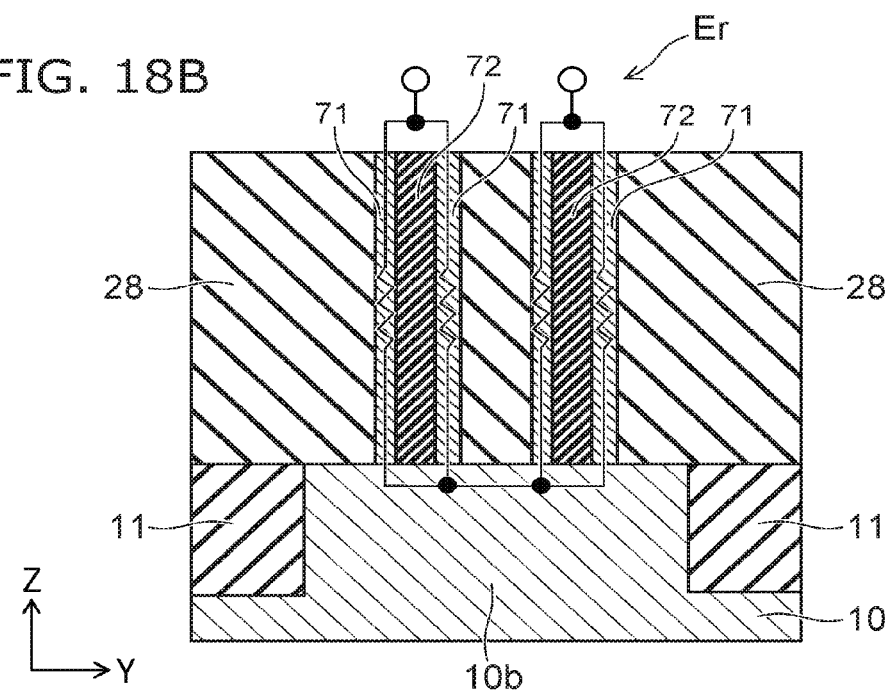
FIG. 18B is a schematic cross-sectional view.

FIG. 18A is a perspective view showing the resistance element of a semiconductor device according to the embodiment; and FIG. 18B is a schematic cross-sectional view.

As shown in FIG. 18A and FIG. 18B, the inter-layer insulating film 28 is provided on the silicon substrate 10 in the resistor region Rr of the semiconductor device 3 according to the embodiment. Then, circular tube conductive pillars 71 are provided to extend in the Z-direction and pierce the inter-layer insulating film 28. The lower ends of the conductive pillars 71 are connected to the silicon substrate 10. The conductive pillars 71 are formed of a conductive material, e.g., silicon including an impurity. An insulating member 72 that is made of, for example, silicon oxide is provided inside the conductive pillar 71. The configuration of the insulating member 72 is, for example, a circular column. Also, similarly to the first embodiment described above, two conductive pillars 71 are connected to each of the portions 10b of the upper layer portion of the silicon substrate 10 partitioned by the STI 11.

The detailed configuration of the semiconductor device 3 will now be described.

Figure 19:
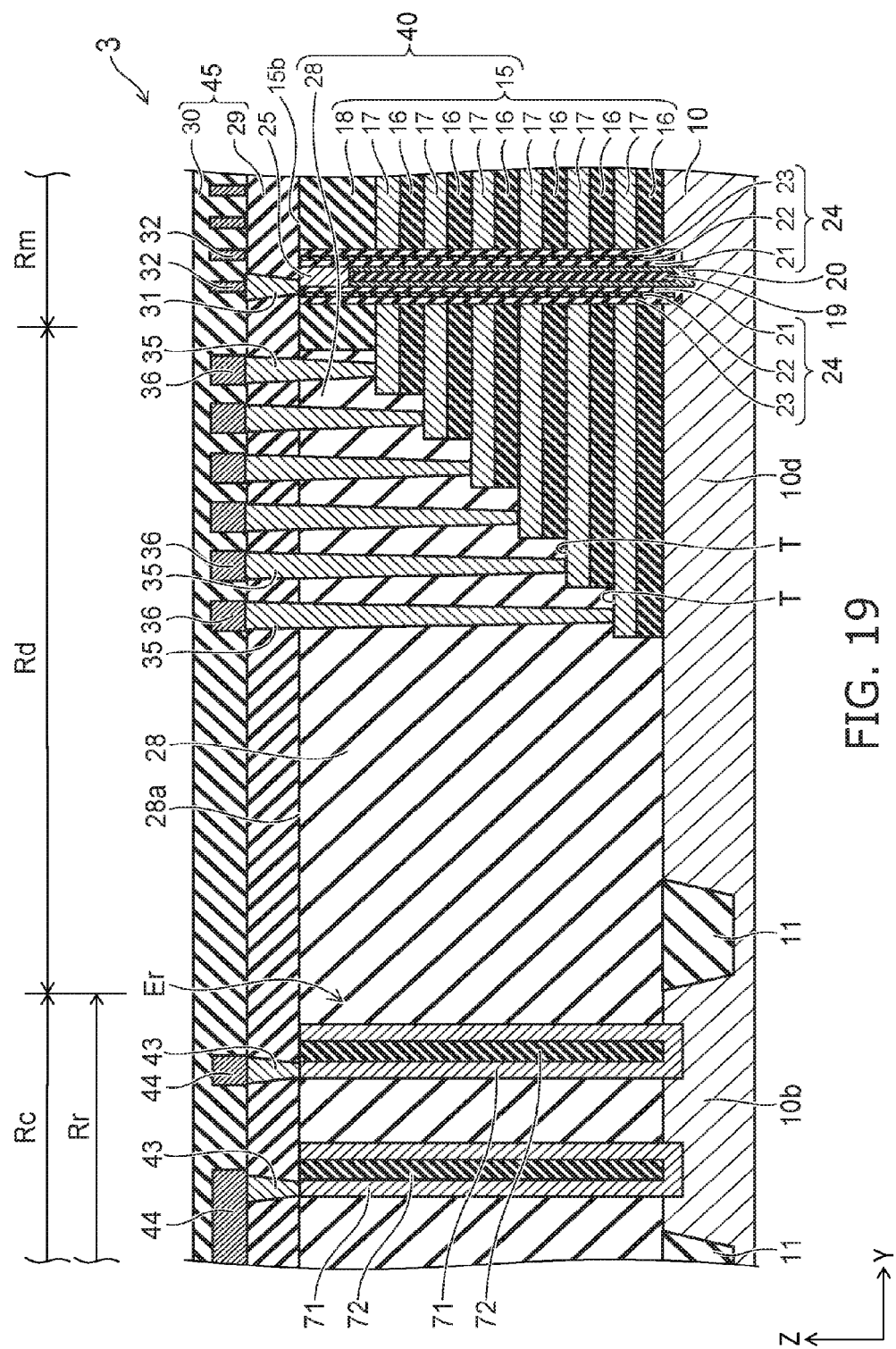
FIG. 19 is a cross-sectional view showing the semiconductor device according to the third embodiment.

FIG. 19 is a cross-sectional view showing the semiconductor device according to the embodiment.

As shown in FIG. 19, the semiconductor device 3 according to the embodiment differs from the semiconductor device 1 according to the first embodiment described above (referring to FIG. 4) in that the stacked body 15n is not provided in the resistor region Rr, and the inter-layer insulating film 28 is provided instead. Also, the memory films 24 and the silicon pillars 20 are not provided in the resistor region Rr; and the conductive pillars 71 contact the inter-layer insulating film 28. The position of the upper surface 28a of the inter-layer insulating film 28 in the Z-direction is the same as the position of the upper surface 15b of the stacked body 15. In other words, the distance between the silicon substrate 10 and the upper surface 28a of the inter-layer insulating film 28 is equal to the distance between the silicon substrate 10 and the upper surface 15b of the stacked body 15.

A method for manufacturing the semiconductor device according to the embodiment will now be described.

The semiconductor device 3 according to the embodiment can be manufactured according to the second embodiment described above with the following modifications or additions. Namely, the stacked body 15n is removed from the resistor region Rr in the process shown in FIG. 12A to FIG. 12F. The inter-layer insulating film 28 is formed also in the resistor region Rr in the process shown in FIG. 13A to FIG. 13F. The formation of the memory film 24 and the silicon pillar 20 on the inner surfaces of the resistor holes 59 is impeded by filling a sacrificial material through the resistor holes 59 in the process shown in FIG. 15A to FIG. 15F. Subsequently, the sacrificial material is removed. The conductive pillars 71 are formed by forming silicon containing an impurity on the inner surfaces of the resistor holes 59 in the process shown in FIG. 17A to FIG. 17F. Subsequently, the insulating members 72 are formed by filling silicon oxide into the interiors of the conductive pillars 71.

Effects of the embodiment will now be described.

According to the embodiment, compared to the first embodiment described above, it is unnecessary to provide the insulating film around the conductive pillars 71 because the insulative inter-layer insulating film 28 is provided around the conductive pillars 71. Thereby, the conductive pillars 71 can be arranged with high integration.

Also, the resistance value of the conductive pillar 71 can be controlled not only by adjusting the diameter of the resistor hole 59 but also by adjusting the silicon amount, i.e., the thickness of the conductive pillar 71, deposited on the inner surface of the resistor hole 59.

Otherwise, the configuration and the effects of the configuration of the embodiment are similar to those of the first embodiment described above. Also, otherwise, the manufacturing method and the effects of the manufacturing method of the embodiment are similar to those of the second embodiment described above.

Fourth Embodiment

A fourth embodiment will now be described.

Figure 20:
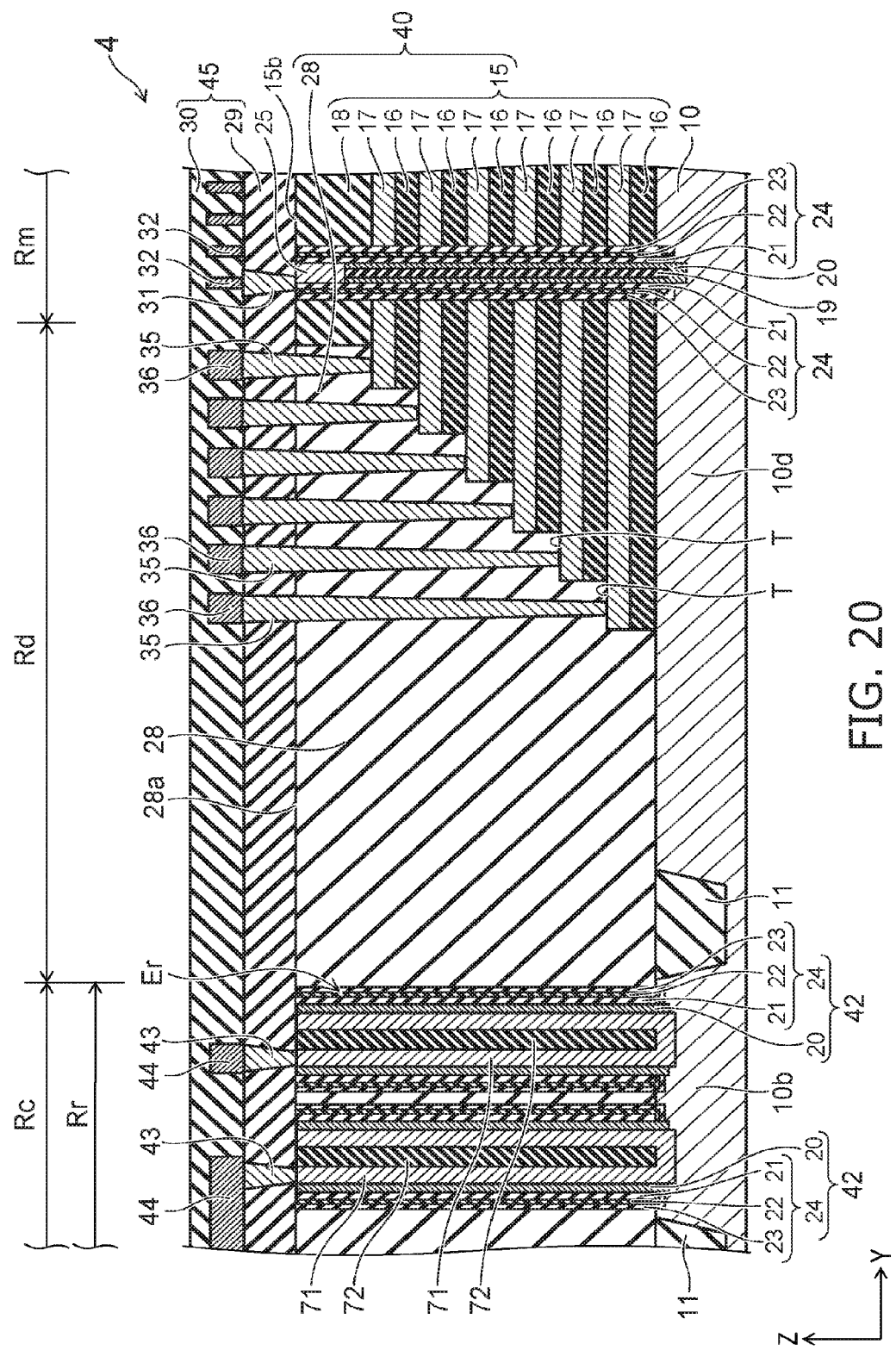
FIG. 20 is a cross-sectional view showing a semiconductor device according to a fourth embodiment.

FIG. 20 is a cross-sectional view showing a semiconductor device according to the embodiment.

As shown in FIG. 20, the semiconductor device 4 according to the embodiment differs from the semiconductor device 3 according to the third embodiment described above (referring to FIG. 18) in that the stacked film 42 that is made of the memory film 24 and the silicon pillar 20 is provided around the conductive pillars 71.

A method for manufacturing the semiconductor device according to the embodiment will now be described.

The semiconductor device 4 according to the embodiment can be manufactured according to the third embodiment described above by forming the memory film 24 and the silicon pillar 20 on the inner surfaces of the resistor holes 59 without filling the sacrificial material into the resistor holes 59 in the process shown in FIG. 15A to FIG. 15F.

Otherwise, the configuration and the effects of the configuration of the embodiment are similar to those of the first embodiment described above. Also, otherwise, the manufacturing method and the effects of the manufacturing method of the embodiment are similar to those of the second embodiment described above.

The embodiments described above also can be implemented in combination with each other.

For example, although an example is illustrated in the first embodiment in which the conductive pillar 41 is provided inside the ONON (Oxide-Nitride-Oxide-Nitride)-type stacked body 15n, the stacked film 42 that includes the insulative memory film 24 is provided between the stacked body 15n and the conductive pillar 41, and the configuration of the conductive pillar 41 is a circular column in which silicon is filled to the center, this is not limited thereto. For example, the configuration of the conductive pillar 41 may be a circular tube. Also, the stacked film 42 may not include the memory film 24.

Also, although an example is illustrated in the third embodiment in which the circular tube conductive pillar 71 is provided inside the inter-layer insulating film 28 made of silicon oxide and the insulating member 72 is provided inside the conductive pillar 71, this is not limited thereto. For example, a circular column conductive pillar 81 may be provided instead of the circular tube conductive pillar 71. Further, although an example is illustrated in the embodiments described above in which the lower ends of the two conductive pillars are connected by the portion 10b of the silicon substrate 10, this is not limited thereto. For example, a conductive member such as an electrode plate, etc., may be provided on the silicon substrate 10; and the lower ends of the two conductive pillars may be connected by the conductive member.

According to the embodiments described above, a semiconductor device including a resistance element having a high resistance value per unit surface area can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a semiconductor substrate, a first portion and a second portion of an upper layer portion of the semiconductor substrate being conductive;
   an insulating member provided on the semiconductor substrate, the insulating member electrically isolating the first portion from the second portion;
   a first stacked body provided in a region directly above the second portion of the semiconductor substrate, the first stacked body including a plurality of first insulating films and a plurality of electrode films, each of the first insulating films and each of the electrode films being stacked alternately;
   a semiconductor pillar provided inside the first stacked body, the semiconductor pillar extending in a stacking direction of the first insulating films and the electrode films;
   a charge storage film provided between the semiconductor pillar and the electrode films;
   a second stacked body provided in a region directly above the first portion of the semiconductor substrate, the second stacked body including a plurality of second insulating films and a plurality of third insulating films, each of the second insulating films and each of the third insulating films being stacked alternately;

two first conductive pillars provided inside the second stacked body, the two first conductive pillars extending in the stacking direction, lower ends of the two first conductive pillars being connected to the first portion;

two second conductive pillars provided inside the second stacked body, the two second conductive pillars extending in the stacking direction; and an interconnect provided on the second stacked body and connected between one of the two first conductive pillars and one of the two second conductive pillars, the insulating member electrically isolating a third portion of the upper layer portion of the semiconductor substrate from the first portion and the second portion, the third portion being conductive, lower ends of the two second conductive pillars being connected to the third portion.

2. The semiconductor device according to claim 1, wherein a diameter of the first conductive pillar is larger than a diameter of the semiconductor pillar.

3. The semiconductor device according to claim 1, wherein the first conductive pillars include silicon.

4. The semiconductor device according to claim 3, wherein the first conductive pillars include at least one type of element selected from the group consisting of arsenic, phosphorus, boron, and gallium.

5. The semiconductor device according to claim 1, further comprising a semiconductor plug provided on the semiconductor pillar, the charge storage film being disposed around the semiconductor plug, a composition of the semiconductor plug being the same as a composition of the first conductive pillars.

6. The semiconductor device according to claim 1, wherein a composition of the second insulating films is the same as a composition of the first insulating films.

7. The semiconductor device according to claim 1, wherein a thickness of the second insulating film is equal to a thickness of the first insulating film.

8. The semiconductor device according to claim 1, wherein a thickness of the third insulating film is equal to a thickness of the electrode film.

9. The semiconductor device according to claim 1, further comprising a fourth insulating film provided around the first conductive pillar, at least a portion of a film configuration of the fourth insulating film being the same as a film configuration of the charge storage film.

10. The semiconductor device according to claim 1, further comprising a core member provided inside the semiconductor pillar, the core member being insulative, a configuration of the semiconductor pillar being a circular tube covering a side surface and a lower surface of the core member, a lower end of the circular tube being sealed, configurations of the first conductive pillars being circular columns.

11. The semiconductor device according to claim 1, wherein the second insulating film includes silicon oxide, and the third insulating film includes silicon nitride.

12. A semiconductor device, comprising:

a semiconductor substrate, a first portion and a second portion of an upper layer portion of the semiconductor substrate being conductive;

an insulating member provided on the semiconductor substrate, the insulating member electrically isolating the first portion from the second portion;

a stacked body provided in a region directly above the second portion of the semiconductor substrate, the stacked body including a plurality of first insulating films and a plurality of electrode films, each of the first insulating films and each of the electrode films being stacked alternately;

a semiconductor pillar provided inside the stacked body, the semiconductor pillar extending in a stacking direction of the first insulating films and the electrode films;

a charge storage film provided between the semiconductor pillar and the electrode films;

a second insulating film provided in a region directly above the first portion of the semiconductor substrate;

two first conductive pillars provided inside the second insulating film, the two first conductive pillars extending in the stacking direction, lower ends of the two first conductive pillars being connected to the first portion;

two second conductive pillars provided inside the second insulating films, the two second conductive pillars extending in the stacking direction; and an interconnect provided on the second insulating films, the interconnect being connected between one of the two first conductive pillars and one of the two second conductive pillars, the insulating member electrically isolating a third portion of the upper layer portion of the semiconductor substrate from the first portion and the second portion, the third portion being conductive, lower ends of the two second conductive pillars being connected to the third portion.

13. The semiconductor device according to claim 12, wherein a distance between the semiconductor substrate and an upper surface of the second insulating film is equal to a distance between the semiconductor substrate and an upper surface of the stacked body.

14. The semiconductor device according to claim 12, wherein a diameter of the first conductive pillar is larger than a diameter of the semiconductor pillar.

15. The semiconductor device according to claim 12, wherein the first conductive pillars include silicon.

16. The semiconductor device according to claim 12, further comprising a semiconductor plug provided on the semiconductor pillar, the charge storage film being disposed around the semiconductor plug, a composition of the semiconductor plug being the same as a composition of the first conductive pillars.

17. The semiconductor device according to claim 12, further comprising a third insulating film provided around the first conductive pillar, at least a portion of a film configuration of the third insulating film being the same as a film configuration of the charge storage film.

18. The semiconductor device according to claim 12, further comprising an insulating pillar provided inside the first conductive pillar, the insulating pillar extending in the stacking direction, the first conductive pillar covering a side surface and a lower surface of the insulating pillar.

* * * * *